(12) United States Patent
Ke et al.

(10) Patent No.: US 11,587,474 B2
(45) Date of Patent: Feb. 21, 2023

(54) FLEXIBLE DEVICE ARRAY SUBSTRATE AND MANUFACTURING METHOD OF FLEXIBLE DEVICE ARRAY SUBSTRATE

(71) Applicant: Au Optronics Corporation, Hsinchu (TW)

(72) Inventors: Tsung-Ying Ke, Hsinchu (TW); Chih-Tsung Lee, Hsinchu (TW); Ting Kang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 267 days.

(21) Appl. No.: 16/920,353

(22) Filed: Jul. 2, 2020

(65) Prior Publication Data

US 2021/0027669 A1    Jan. 28, 2021

Related U.S. Application Data

(60) Provisional application No. 62/877,883, filed on Jul. 24, 2019.

(30) Foreign Application Priority Data

Apr. 17, 2020  (TW) ................................ 109112898

(51) Int. Cl.
*G09F 9/30* (2006.01)
*H01L 27/32* (2006.01)
(Continued)

(52) U.S. Cl.
CPC ............ *G09F 9/301* (2013.01); *H01L 27/322* (2013.01); *H01L 33/0095* (2013.01);
(Continued)

(58) Field of Classification Search
CPC .... G09F 9/301; H01L 33/0095; H01L 33/486
See application file for complete search history.

(56) References Cited

U.S. PATENT DOCUMENTS

| 6,887,650 B2 | 5/2005 | Shimoda et al. |
| 7,189,631 B2 | 3/2007 | Yamazaki et al. |

(Continued)

FOREIGN PATENT DOCUMENTS

| CN | 100539190 | 9/2009 |
| CN | 102047396 | 1/2013 |

(Continued)

OTHER PUBLICATIONS

Translation of Chinese first action (Year: 2021).*

*Primary Examiner* — Tracie Y Green
(74) *Attorney, Agent, or Firm* — JCIPRNET

(57) ABSTRACT

A flexible device array substrate includes: a substrate, a metal-containing layer, and an electronic component layer. The metal-containing layer is disposed on the substrate. The metal-containing layer includes: a first layer and a second layer. The first layer is located on a side close to the substrate, and the first layer contains a first metal oxide to form a peeling interface in the first layer. The second layer is located on a side away from the substrate, and the second layer contains a second metal oxide. The oxidation number of the metal in the second metal oxide is smaller than the oxidation number of the metal in the first metal oxide. The electronic component layer is disposed above the metal-containing layer. A method of manufacturing the flexible device array substrate is also provided.

32 Claims, 22 Drawing Sheets

(51) Int. Cl.
*H01L 33/00* (2010.01)
*H01L 33/48* (2010.01)
*H01L 51/56* (2006.01)
*H01L 51/52* (2006.01)

(52) U.S. Cl.
CPC ........ *H01L 33/486* (2013.01); *H01L 51/5246* (2013.01); *H01L 51/5275* (2013.01); *H01L 51/56* (2013.01); *H01L 2251/5338* (2013.01)

(56) References Cited

U.S. PATENT DOCUMENTS

| | | | |
|---|---|---|---|
| 7,547,612 | B2 | 6/2009 | Yamazaki et al. |
| 7,723,209 | B2 | 5/2010 | Maruyama et al. |
| 7,923,348 | B2 | 4/2011 | Yamazaki et al. |
| 8,012,854 | B2 | 9/2011 | Yamazaki et al. |
| 8,173,520 | B2 | 5/2012 | Yamazaki et al. |
| 8,247,246 | B2 | 8/2012 | Maruyama et al. |
| 8,343,822 | B2 | 1/2013 | Hirano et al. |
| 8,415,679 | B2 | 4/2013 | Yamazaki et al. |
| 8,525,172 | B2 | 9/2013 | Hirano et al. |
| 8,691,604 | B2 | 4/2014 | Maruyama et al. |
| 9,224,667 | B2 | 12/2015 | Yamazaki et al. |
| 9,269,817 | B2 | 2/2016 | Maruyama et al. |
| 9,508,620 | B2 | 11/2016 | Yamazaki et al. |
| 9,543,337 | B2 | 1/2017 | Maruyama et al. |
| 9,799,829 | B2 | 10/2017 | Yasumoto et al. |
| 9,929,190 | B2 | 3/2018 | Yamazaki et al. |
| 10,038,012 | B2 | 7/2018 | Maruyama et al. |
| 10,388,875 | B2 | 8/2019 | Yasumoto et al. |
| 10,955,976 | B2 | 3/2021 | Xu et al. |
| 2003/0022403 | A1 | 1/2003 | Shimoda et al. |
| 2004/0129960 | A1 | 7/2004 | Maruyama et al. |
| 2004/0232413 | A1 | 11/2004 | Yamazaki et al. |
| 2005/0106839 | A1 | 5/2005 | Shimoda et al. |
| 2007/0158745 | A1 | 7/2007 | Yamazaki et al. |
| 2009/0275196 | A1 | 11/2009 | Yamazaki et al. |
| 2010/0248402 | A1 | 9/2010 | Maruyama et al. |
| 2010/0283054 | A1 | 11/2010 | Hirano et al. |
| 2011/0159771 | A1 | 6/2011 | Yamazaki et al. |
| 2011/0312111 | A1 | 12/2011 | Yamazaki et al. |
| 2012/0211874 | A1 | 8/2012 | Yamazaki et al. |
| 2013/0029447 | A1 | 1/2013 | Maruyama et al. |
| 2013/0168677 | A1 | 7/2013 | Hirano et al. |
| 2013/0214434 | A1 | 8/2013 | Yamazaki et al. |
| 2014/0203415 | A1 | 7/2014 | Maruyama et al. |
| 2015/0311439 | A1 | 10/2015 | Yamazaki et al. |
| 2016/0028034 | A1 | 1/2016 | Yasumoto et al. |
| 2016/0104725 | A1 | 4/2016 | Maruyama et al. |
| 2016/0111683 | A1 | 4/2016 | Kachatryan et al. |
| 2017/0047359 | A1 | 2/2017 | Yamazaki et al. |
| 2017/0243895 | A1 | 8/2017 | Maruyama et al. |
| 2017/0302772 | A1* | 10/2017 | Zhang .................... G09F 9/301 |
| 2018/0047902 | A1 | 2/2018 | Yasumoto et al. |
| 2018/0108716 | A1 | 4/2018 | Xu et al. |
| 2018/0308867 | A1 | 10/2018 | Maruyama et al. |
| 2019/0245156 | A1* | 8/2019 | Kwon ................. H01L 51/5284 |
| 2020/0341323 | A1* | 10/2020 | Reeves ............... G02F 1/13338 |

FOREIGN PATENT DOCUMENTS

| | | |
|---|---|---|
| CN | 103236418 | 8/2013 |
| CN | 107644928 | 1/2018 |
| CN | 109742265 | 5/2019 |
| TW | 586231 | 5/2004 |
| TW | I316753 | 11/2009 |
| TW | 201616703 | 5/2016 |
| TW | I626631 | 6/2018 |

\* cited by examiner

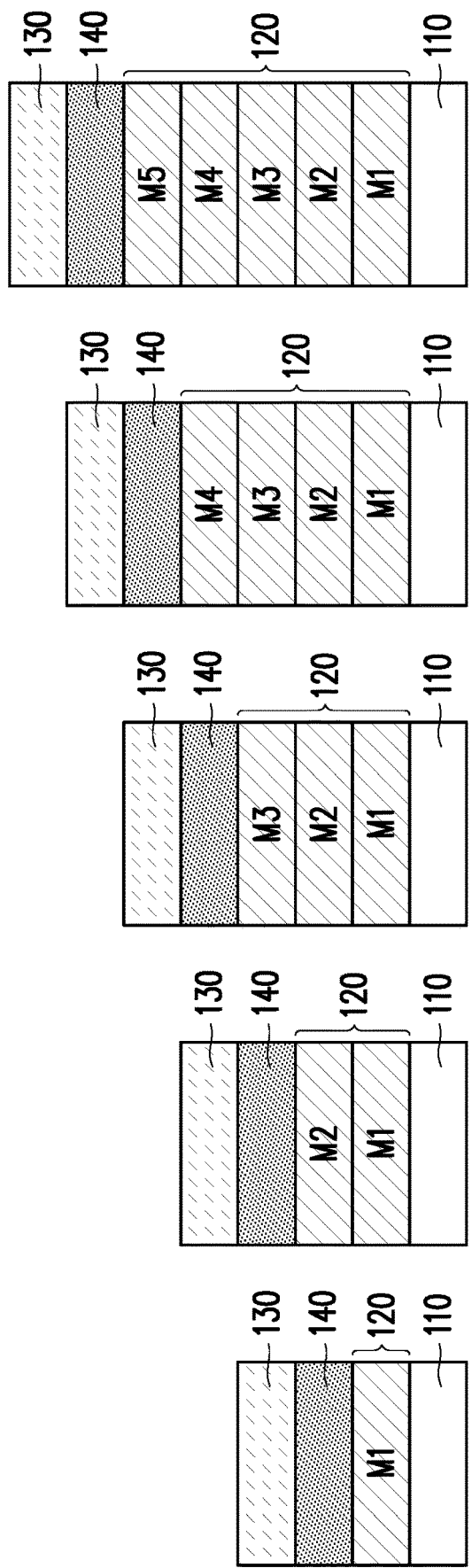

FLEXIBLE DEVICE ARRAY SUBSTRATE AND MANUFACTURING METHOD OF FLEXIBLE DEVICE ARRAY SUBSTRATE

CROSS-REFERENCE TO RELATED APPLICATION

This application claims the priority benefits of U.S. provisional application Ser. No. 62/877,883, filed on Jul. 24, 2019, and Taiwan application serial no. 109112898, filed on Apr. 17, 2020. The entirety of each of the above-mentioned patent applications is hereby incorporated by reference herein and made a part of this specification.

BACKGROUND

Technical Field

The disclosure relates to a device array substrate and a method of manufacturing the device array substrate, and in particular relates to a flexible device array substrate and a method of manufacturing the flexible device array substrate.

Description of Related Art

In general, a manufacturing method of a flexible display panel that is bendable includes: a flexible device array substrate manufacturing process and a module manufacturing process.

The flexible device array substrate manufacturing process includes the following steps. First, a glass carrier is provided. Next, a flexible substrate, such as a polyimide (PI) substrate, is formed on the glass carrier, and then a barrier layer is formed on the flexible substrate. After that, an electronic component layer, a display element layer, an optical clear adhesive layer (OCA layer), and a cover lens layer are sequentially formed on the barrier layer. Finally, the glass carrier is peeled off from the flexible substrate by using a laser-lift-off method or a mechanical debonding method, so as to obtain a flexible device array substrate composed of the flexible substrate, the barrier layer, the electronic component layer, the display element layer, the optical clear adhesive layer, and the cover lens layer.

The module manufacturing process includes the following steps. First, a pressure sensitive adhesive (PSA) and a back foil (BF) are sequentially disposed on a side of the flexible substrate of the above-described flexible device array substrate. Thereafter, a pressure sensitive adhesive and a stainless foil (SUS foil) are sequentially disposed on a side of the back foil. The stainless foil imparts toughness to the flexible device array substrate so that the flexible device array substrate is bendable.

However, in the flexible device array substrate manufacturing process described above, when the glass carrier is peeled off from the flexible substrate, uneven stress may easily cause the flexible device array substrate to break. Furthermore, since the structure of multiple layers of the flexible device array substrate is not crack-resistant, defects may be easily generated inside the multiple layers, resulting in bubbles, cracks, or peeling.

SUMMARY

The disclosure provides a flexible device array substrate having a favorable structure, and a manufacturing method of the flexible device array substrate.

The disclosure provides a flexible device array substrate, including: a substrate, a metal-containing layer, and an electronic component layer. The metal-containing layer is disposed on the substrate. The metal-containing layer includes: a first layer located on a side close to the substrate, the first layer including a first metal oxide to form a peeling interface in the first layer; and a second layer located on a side away from the substrate, the second layer including a second metal oxide, wherein an oxidation number of a metal in the second metal oxide is smaller than an oxidation number of a metal in the first metal oxide. The electronic component layer is disposed above the metal-containing layer.

In an embodiment of the disclosure, a metal of the metal-containing layer is selected from molybdenum (Mo), vanadium (V), niobium (Nb), tantalum (Ta), tungsten (W), rhenium (Re), chromium (Cr), and a combination thereof.

In an embodiment of the disclosure, the metal-containing layer includes a single-layer structure.

In an embodiment of the disclosure, the metal-containing layer includes a multi-layer structure.

In an embodiment of the disclosure, the second layer includes a metal with an oxidation number being zero.

In an embodiment of the disclosure, the flexible device array substrate further includes: a barrier layer disposed between the metal-containing layer and the electronic component layer.

In an embodiment of the disclosure, the flexible device array substrate further includes: a flexible layer disposed between the barrier layer and the metal-containing layer.

In an embodiment of the disclosure, the flexible device array substrate further includes: a display element layer disposed on the electronic component layer. The display element layer includes a first light emitting element, a second light emitting element, and a third light emitting element disposed adjacent to each other.

In an embodiment of the disclosure, the flexible device array substrate further includes: an optical clear adhesive layer disposed on the display element layer; and a cover lens layer disposed on the optical clear adhesive layer.

The disclosure provides a manufacturing method of a flexible device array substrate, including: providing a substrate; forming a metal-containing layer on the substrate; performing a thermal process for the metal-containing layer to form a first layer and a second layer, wherein the first layer is located on a side close to the substrate, the first layer includes a first metal oxide to form a peeling interface in the first layer, the second layer is located on a side away from the substrate, and the second layer includes a second metal oxide, wherein an oxidation number of a metal in the second metal oxide is smaller than an oxidation number of a metal in the first metal oxide; forming an electronic component layer above the metal-containing layer; and performing a peeling operation to separate a part of the first layer and the substrate at the peeling interface.

In an embodiment of the disclosure, a metal of the metal-containing layer is selected from molybdenum, vanadium, niobium, tantalum, tungsten, rhenium, chromium, and a combination thereof.

In an embodiment of the disclosure, the metal-containing layer includes a single-layer structure.

In an embodiment of the disclosure, the metal-containing layer includes a multi-layer structure.

In an embodiment of the disclosure, the second layer includes a metal with an oxidation number being zero.

In an embodiment of the disclosure, the manufacturing method of the flexible device array substrate further includes: forming a barrier layer between the metal-containing layer and the electronic component layer.

In an embodiment of the disclosure, the manufacturing method of the flexible device array substrate further includes: forming a display element layer on the electronic component layer. The display element layer includes a first light emitting element, a second light emitting element, and a third light emitting element disposed adjacent to each other.

In an embodiment of the disclosure, the manufacturing method of the flexible device array substrate further includes: sequentially forming an optical clear adhesive layer and a cover lens layer on the display element layer.

In an embodiment of the disclosure, a temperature range of the thermal process is 350° C. to 650° C.

In an embodiment of the disclosure, a temperature range of the thermal process is 500° C. to 650° C.

In an embodiment of the disclosure, the thermal process is performed before the electronic component layer is formed.

In an embodiment of the disclosure, the thermal process is performed when the electronic component layer is formed.

In an embodiment of the disclosure, the manufacturing method of the flexible device array substrate further includes: performing a rapid thermal annealing process before the electronic component layer is formed.

In an embodiment of the disclosure, the manufacturing method of the flexible device array substrate further includes: leaving a pattern of the second layer at least in a bent area of the flexible device array substrate after the peeling operation.

In an embodiment of the disclosure, the manufacturing method of the flexible device array substrate further includes: forming a thickened pattern layer on the pattern of the second layer.

The disclosure also provides a flexible device array substrate, including a display area and a bent area located on a side of the display area. The flexible device array substrate includes: a first film; a metal-containing layer disposed on a first surface of the first film and located at least in the bent area; and an electronic component layer disposed on a second surface of the first film. The second surface and the first surface are opposite to each other.

In an embodiment of the disclosure, the flexible device array substrate further includes: a display element layer disposed on the electronic component layer. The display element layer includes a first light emitting element, a second light emitting element, and a third light emitting element disposed adjacent to each other.

In an embodiment of the disclosure, the flexible device array substrate further includes: an optical clear adhesive layer disposed on the display element layer; and a cover lens layer disposed on the optical clear adhesive layer.

In an embodiment of the disclosure, the metal-containing layer includes: a first part and a second part connected to each other. The first part is disposed in the display area, and the second part is disposed in the bent area. In an embodiment of the disclosure, the flexible device array substrate further includes: a thickened pattern layer disposed on the metal-containing layer.

In an embodiment of the disclosure, the metal-containing layer includes: a first part and a second part separated from each other. The first part is disposed in the display area, and the second part is disposed in the bent area. In an embodiment of the disclosure, the flexible device array substrate further includes: a thickened pattern layer disposed on the first part of the metal-containing layer.

In an embodiment of the disclosure, the first film includes a bent part, and the metal-containing layer is disposed on the bent part. A bending direction of the bent part is opposite to light emitting directions of the first light emitting element, the second light emitting element, and the third light emitting element. In an embodiment of the disclosure, the flexible device array substrate further includes: a thickened pattern layer disposed on the metal-containing layer located on the bent part.

In an embodiment of the disclosure, a pattern of the metal-containing layer is disposed corresponding to intervals between the first light emitting element, the second light emitting element, and the third light emitting element. In an embodiment of the disclosure, the flexible device array substrate further includes: a thickened pattern layer disposed on the pattern of the metal-containing layer.

In an embodiment of the disclosure, the flexible device array substrate further includes: a second film carrying the display element layer; a color filter pattern layer disposed corresponding to the display element layer and including a first filter pattern, a second filter pattern, and a third filter pattern disposed adjacent to each other; and a thickened pattern layer disposed on the metal-containing layer located on the bent part of the first film, wherein the color filter pattern layer is located between the first film and the second film, and the first film and the second film are flexible substrates.

Based on the above, in the flexible device array substrate and the manufacturing method thereof according to the embodiments of the disclosure, a layer of metal oxide layer with a high oxidation number is formed between the substrate and the metal of the metal-containing layer by a thermal process. In this layer, a peeling interface is formed. A part of the first layer and the substrate can be easily separated at the peeling interface, so as to easily remove the second layer of the metal-containing layer together with the electronic component layer above. Thus, the manufacturing yield of the flexible device array substrate is improved, and the flexible device array substrate has favorable toughness.

Furthermore, in the flexible device array substrate and the manufacturing method thereof according to the disclosure, the metal-containing layer may be further processed (such as a patterning process and a thickening process), so as to improve the light permeability, protection, toughness, and flexibility of the flexible device array substrate. In addition, the metal layer may be partially thickened for areas that require structural protection or electromagnetic shielding protection.

In order to make the above and other features and advantages of the disclosure more comprehensible, exemplary embodiments are described in detail below with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 7A to FIG. 7E are schematic views of the cross-sectional structures of the metal-containing layer according to embodiments of the disclosure.

DETAILED DESCRIPTION OF DISCLOSED EMBODIMENTS

Figure 1A:
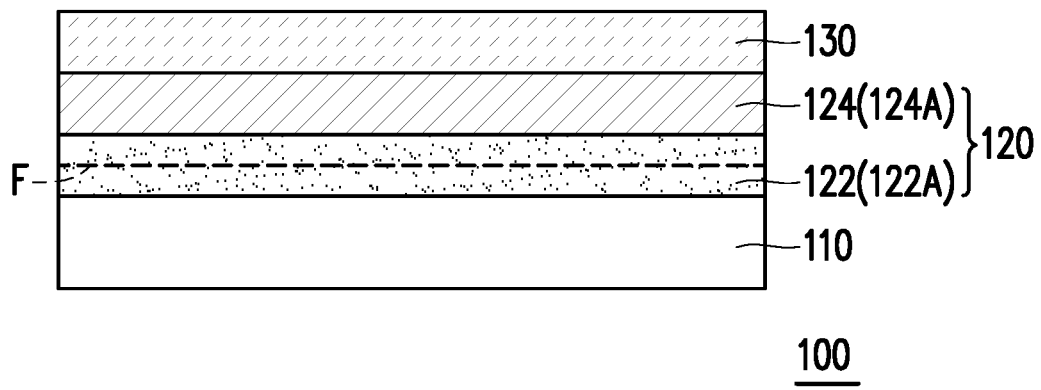
FIG. 1A to FIG. 1C are schematic cross-sectional views of a flexible device array substrate according to an embodiment of the disclosure.
Figure 1B:
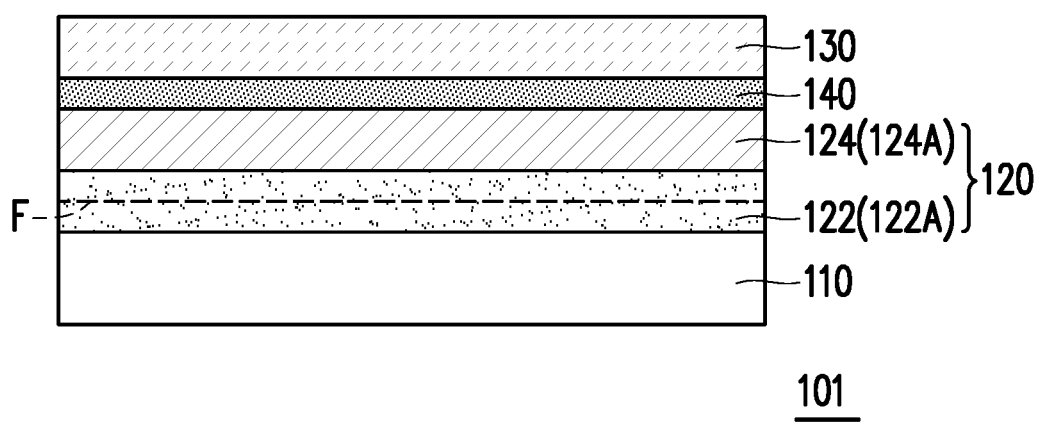
Figure 1C:
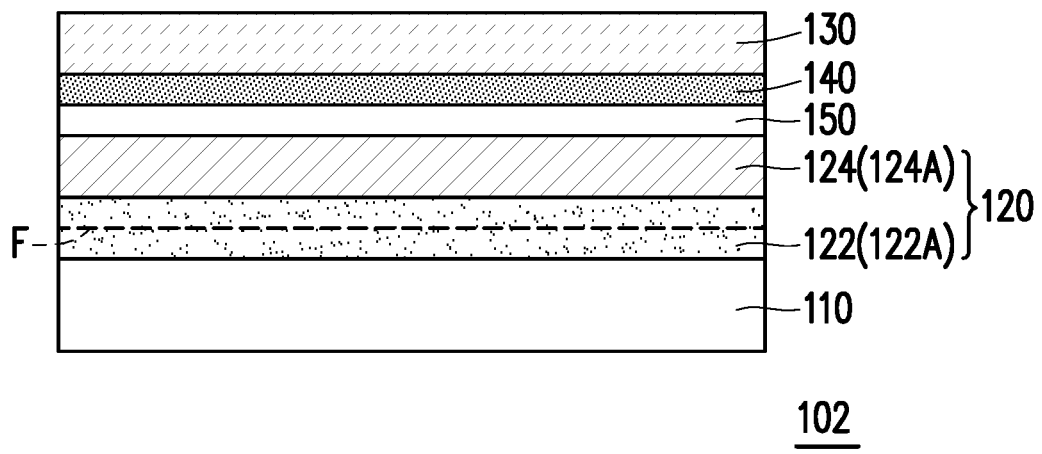

FIG. 1A to FIG. 1C are schematic cross-sectional views of a flexible device array substrate according to an embodiment of the disclosure. In the embodiment of FIG. 1A to FIG. 1C, the same elements are marked with the same reference numerals in the related description.

Referring to FIG. 1A, the flexible device array substrate 100 of the embodiment includes a substrate 110, a metal-containing layer 120, and an electronic component layer 130. The metal-containing layer 120 is disposed on the substrate 110. The metal-containing layer 120 includes a first layer 122 and a second layer 124. The first layer 122 is located on a side close to the substrate 110. The first layer 122 contains a first metal oxide 122A to form a peeling interface F in the first layer 122. The second layer 124 is located on a side away from the substrate 110. The second layer 124 contains a second metal oxide 124A. An oxidation number of a metal in the second metal oxide 124A is smaller than an oxidation number of a metal in the first metal oxide 122A. The electronic component layer 130 is disposed above the metal-containing layer 120.

Referring to FIG. 1A, the substrate 110 is, for example, a glass substrate or a non-glass substrate deposited with an oxide layer (the oxide layer provides oxygen atoms). In an example where the substrate 110 is a glass substrate, since the main component of glass is silicon dioxide and silicon dioxide also provides oxygen atoms, the metal of the metal-containing layer 120 is oxidized with the oxygen atoms.

The metal of the metal-containing layer 120 is, for example, a transition metal having multiple oxidation states. In an embodiment, the metal of the metal-containing layer 120 is selected from molybdenum, vanadium, niobium, tantalum, tungsten, rhenium, chromium, and a combination thereof. In detail, the metal of the metal-containing layer 120 is, for example, molybdenum (Mo), a high-temperature metal close to molybdenum, or a "metal with an acidic metal oxide" such as vanadium, niobium, tantalum, tungsten, rhenium, and chromium.

Referring to FIG. 1A, the first layer 122 contains the first metal oxide 122A. The first metal oxide 122A is a metal oxide with a high oxidation number. Since the metal oxide has a weak cohesion force, a peeling interface F is formed in the first layer 122. With the peeling interface F, the first layer 122 can be easily separated between layers, so that a part of the first layer 122 and the substrate 110 can be easily separated from each other. Thus, the influence of the stress of the peeling operation on the layers in the flexible device array substrate 100 is reduced, thereby preventing the layers from cracking. In addition, the second layer 124 may contain a metal with the oxidation number being zero. That is to say, the second layer 124 may contain a metal that has not reacted with oxygen atoms.

Referring to FIG. 1A, the electronic component layer 130 is, for example, an active device array layer. The active device is, for example, a thin film transistor or other suitable switch elements, which is not limited herein.

Referring to FIG. 1B, the flexible device array substrate 101 of the embodiment further includes, for example, a barrier layer 140 disposed between the metal-containing layer 120 and the electronic component layer 130. The barrier layer 140 uses, for example, an inorganic layer stack of nitrogen oxide. With the barrier layer 140, the electrical connection between the electronic component layer 130 and the metal-containing layer 120 is cut off to prevent the electrical properties of the electronic component layer 130 from being affected by the metal of the metal-containing layer 120.

Referring to FIG. 1C, the flexible device array substrate 102 of the embodiment further includes, for example, a flexible layer 150 disposed between the barrier layer 140 and the metal-containing layer 120. The material of the flexible layer 150 is, for example, polyimide (PI). With the flexible layer 150, the flexibility of the flexible device array substrate 102 is improved.

Figure 2:
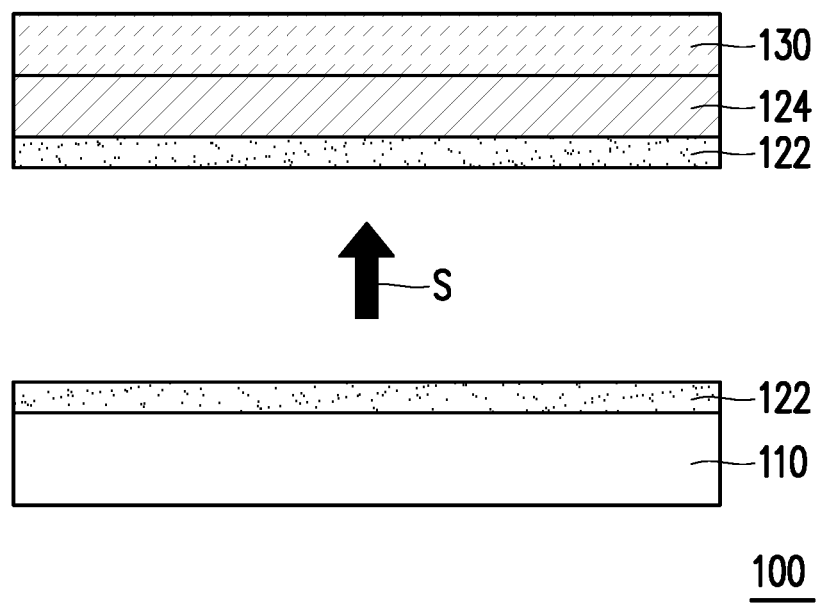
FIG. 2 is a schematic view of performing a peeling operation on the flexible device array substrate of FIG. 1A.

FIG. 2 is a schematic view of performing a peeling operation on the flexible device array substrate of FIG. 1A. Referring to both FIG. 1A and FIG. 2, after the electronic component layer 130 is completed, an external force is applied to the flexible device array substrate 100 to perform the peeling operation S, and a part of the first layer 122 and the substrate 110 are separated from each other at the peeling interface F.

In the manufacturing process of the flexible device array substrate 100, energy is given to the interface between the metal-containing layer 120 and the substrate 110 (for example, a thermal process). At this time, the oxygen atoms from the substrate 110 oxidize with the metal-containing layer 120. Then, the first layer 122 containing the first metal oxide 122A is formed between the substrate 110 and the metal-containing layer 120.

Due to the influence of diffusion, relative to the first layer 122, the second layer 124 located on the side away from the substrate 110 receives fewer oxygen atoms. Therefore, the oxidation number of the metal in the second metal oxide 124A contained in the second layer 124 is smaller than the oxidation number of the metal in the first metal oxide 122A of the first layer 122. In addition, the second layer 124 may also contain a metal with the oxidation number being zero, that is, a metal that has not reacted with oxygen atoms.

After the thermal process, inside the first layer 122 of the first metal oxide 122A with a high oxidation number, the cohesion force of the first metal oxide 122A is reduced, so the peeling interface F that facilitates peeling is formed. That is to say, when a part of the first layer 122 and the substrate 110 are separated from each other by using the peeling interface F, the applied external force does not affect the electronic component layer 130, thereby improving the manufacturing yield of the electronic component in the electronic component layer 130.

FIG. 3A to FIG. 3H are schematic cross-sectional views showing a manufacturing method of the flexible device array substrate according to an embodiment of the disclosure.

Please refer to FIG. 3A to FIG. 3E first to understand the manufacturing process of the flexible device array substrate 101 according to an embodiment of the disclosure.

Figure 3A:
FIG. 3A to FIG. 3H are schematic cross-sectional views showing a manufacturing method of the flexible device array substrate according to an embodiment of the disclosure.

Referring to FIG. 3A, first, the substrate 110 is provided. The substrate 110 is, for example, a glass substrate or a non-glass substrate deposited with an oxide layer. As described above, the substrate 110 provides oxygen atoms for oxidizing the metal of the metal-containing layer 120 which is provided later.

Figure 3B:
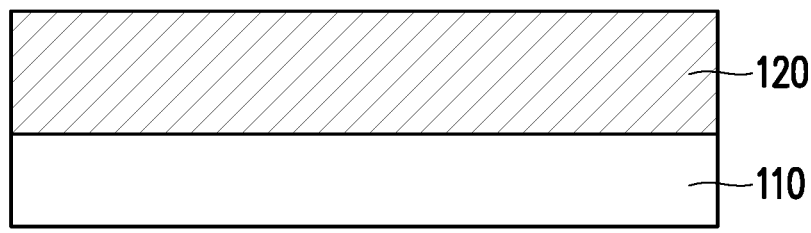

Referring to FIG. 3B, the metal-containing layer 120 is formed on the substrate 110. The metal of the metal-containing layer 120 is, for example, a transition metal having multiple oxidation states. In an embodiment, the metal of the metal-containing layer 120 is selected from molybdenum, vanadium, niobium, tantalum, tungsten, rhenium, chromium, and a combination thereof.

In an embodiment, the metal of the metal-containing layer 120 is, for example, molybdenum oxide (MoO) with divalent molybdenum ($Mo^{2+}$). In another embodiment, the metal of the metal-containing layer 120 is, for example, molybdenum with zero-valent molybdenum (Mo). That is, the metal-containing layer 120 includes, for example, a metal with the oxidation number being zero, or a combination of a metal with the oxidation number being zero and a metal oxide of a metal with a low oxidation number.

Figure 3C:
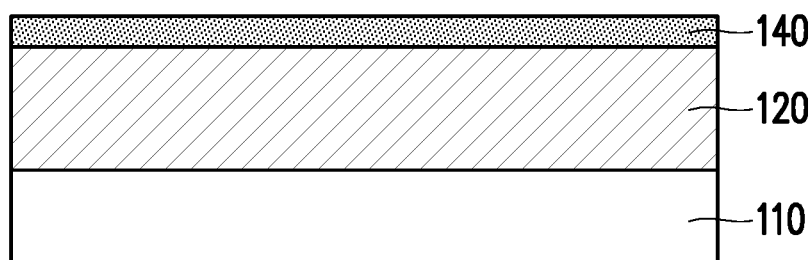

Referring to FIG. 3C, the barrier layer 140 is formed on the metal-containing layer 120. The barrier layer 140 uses, for example, an inorganic layer stack of nitrogen oxide. The barrier layer 140 prevents the metal-containing layer 120 located below from affecting the electrical properties of other layers formed above.

Figure 3D:
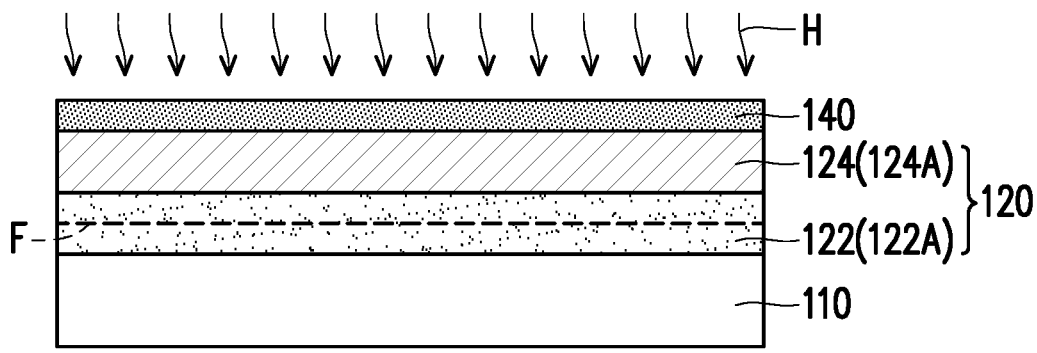

Referring to FIG. 3D, the thermal process H is performed for the metal-containing layer 120 to form the first layer 122 and the second layer 124. The first layer 122 is located on the side close to the substrate 110. The first layer contains the first metal oxide 122A to form the peeling interface F in the first layer 122. The second layer 124 is located on the side away from the substrate 110. The second layer 124 contains the second metal oxide 124A. The oxidation number of the metal in the second metal oxide 124A is smaller than the oxidation number of the metal in the first metal oxide 122A.

Figure 3E:
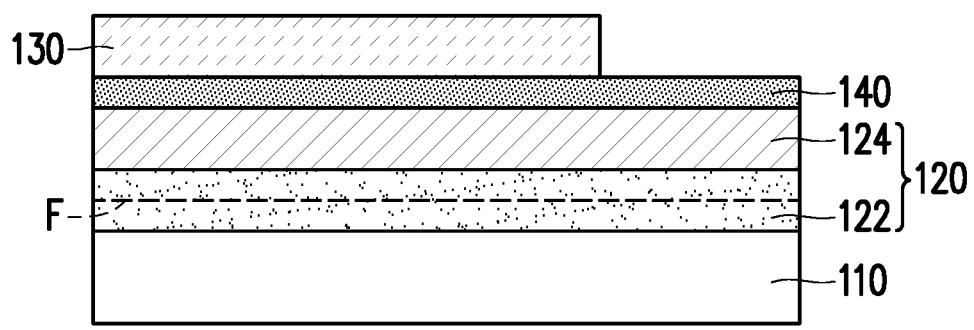

Referring to both FIG. 3D and FIG. 3E, the thermal process H is performed before the step of forming the electronic component layer 130 (as shown in the subsequent FIG. 3E). The temperature range of the thermal process H is, for example, 350° C. to 650° C. In another embodiment, the temperature range of the thermal process H is, for example, 500° C. to 650° C.

Referring to FIG. 3E, the electronic component layer 130 is formed above the metal-containing layer 120. The electronic component layer 130 is, for example, an active device array layer. The active device is, for example, a thin film transistor or other suitable switch elements. At this point, the flexible device array substrate 101 as shown in FIG. 1B is completed.

Further, please continue to refer to FIG. 3A to FIG. 3E and FIG. 3F to understand the manufacturing process of the flexible device array substrate 103 according to an embodiment of the disclosure.

Figure 3F:
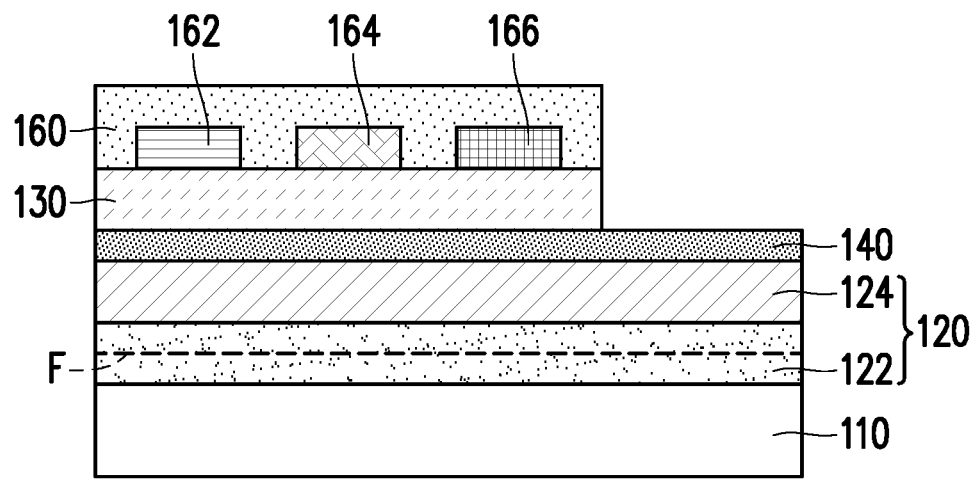

After the steps of FIG. 3A to FIG. 3E, as shown in FIG. 3F, a display element layer 160 is further formed on the electronic component layer 130. The display element layer 160 includes, for example, a first light emitting element 162, a second light emitting element 164, and a third light emitting element 166 disposed adjacent to each other. At this point, the flexible device array substrate 103 is completed.

That is, referring to FIG. 3F, the flexible device array substrate 103 of the embodiment further includes the display element layer 160 disposed on the electronic component layer 130. The display element layer 160 includes the first light emitting element 162, the second light emitting element 164, and the third light emitting element 166 disposed adjacent to each other.

The first light emitting element 162 is, for example, a red light emitting diode, the second light emitting element 164 is, for example, a green light emitting diode, and the third light emitting element 166 is, for example, a blue light emitting diode. In addition, thin film encapsulation (TFE) may be used to encapsulate the first light emitting element 162, the second light emitting element 164, and the third light emitting element 166, so that the display element layer 160 is bendable.

Further, please continue to refer to FIG. 3A to FIG. 3E and FIG. 3F to FIG. 3G to understand the manufacturing process of the flexible device array substrate 104 according to an embodiment of the disclosure.

Figure 3G:
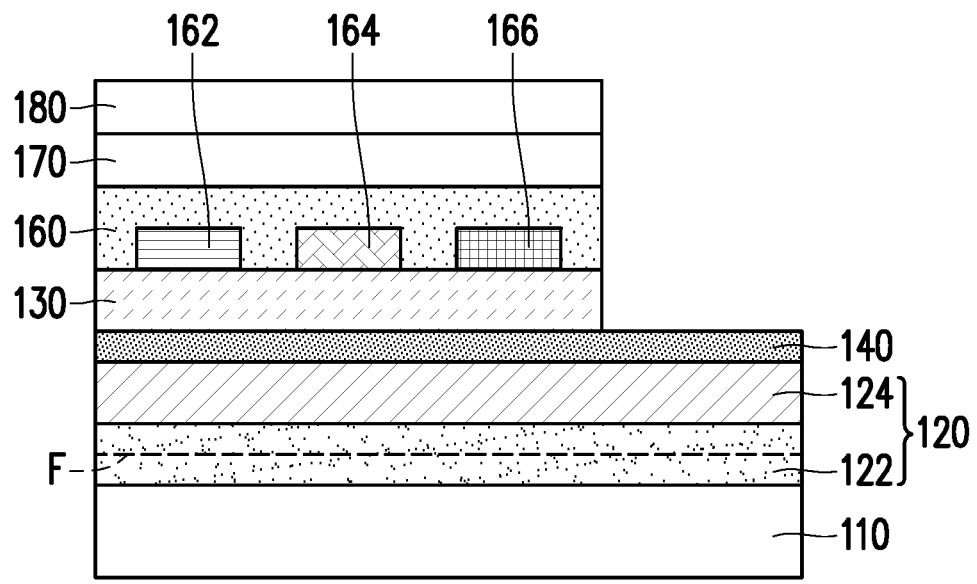

After the steps of FIG. 3A to FIG. 3F, as shown in FIG. 3G, an optical clear adhesive layer 170 and a cover lens layer 180 are sequentially formed on the display element layer 160. At this point, the flexible device array substrate 104 is completed.

That is, referring to FIG. 3G, the flexible device array substrate 104 of the embodiment further includes the optical clear adhesive layer 170 disposed on the display element layer 160; and the cover lens layer 180 disposed on the optical clear adhesive layer 170. With the optical clear adhesive layer 170 and the cover lens layer 180, the optical properties of the display element layer 160 are improved and the display effect of the display element layer 160 is optimized.

Figure 3H:
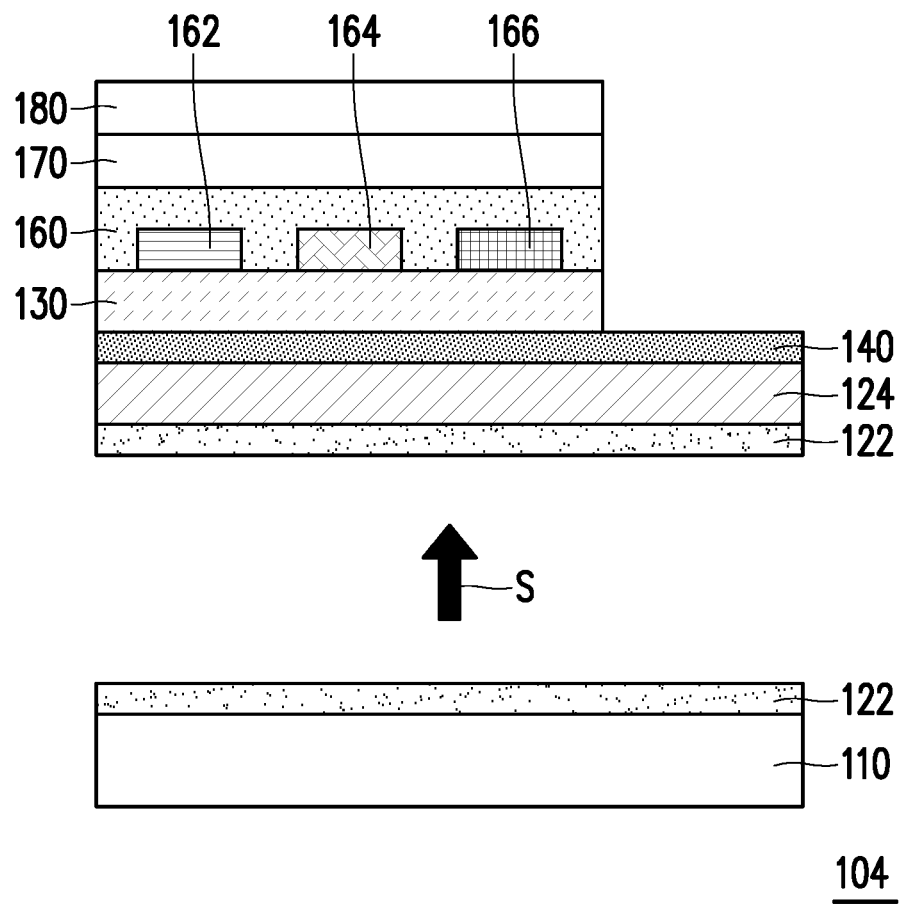

Referring to FIG. 3H, after the flexible device array substrate 104 is completed, the peeling operation S is further performed to separate a part of the first layer 122 and the substrate 110 from each other at the peeling interface F (as shown in FIG. 3G). Th peeling operation S may also be performed after the flexible device array substrate 101 as shown in FIG. 3E is completed, or the peeling operation S may also be performed after the flexible device array substrate 103 as shown in FIG. 3F is completed.

As described above, in the manufacturing method of the flexible device array substrates 100, 101, 102, 103, and 104 according to the embodiment of the disclosure, the metal-containing layer 120 is disposed on the substrate 110 (for example, a glass substrate). By performing the thermal process H at the interface between the substrate 110 and the metal-containing layer 120, the first layer 122 (the first metal oxide 122A with a high oxidation number) and the second layer 124 (the second metal oxide 122B with a low oxidation number) are formed.

Since the first metal oxide 122A is a metal oxide with a high oxidation number, the cohesion force is weak, and the peeling interface F is formed in the first layer 122. With the peeling interface F, the first layer 122 can be easily separated between layers, so that a part of the first layer 122 and the substrate 110 can be easily separated from each other to reduce the influence of the peeling stress on the layers in the flexible device array substrates 100, 101, 102, 103, and 104, and prevent the layers from cracking.

Figure 4A:
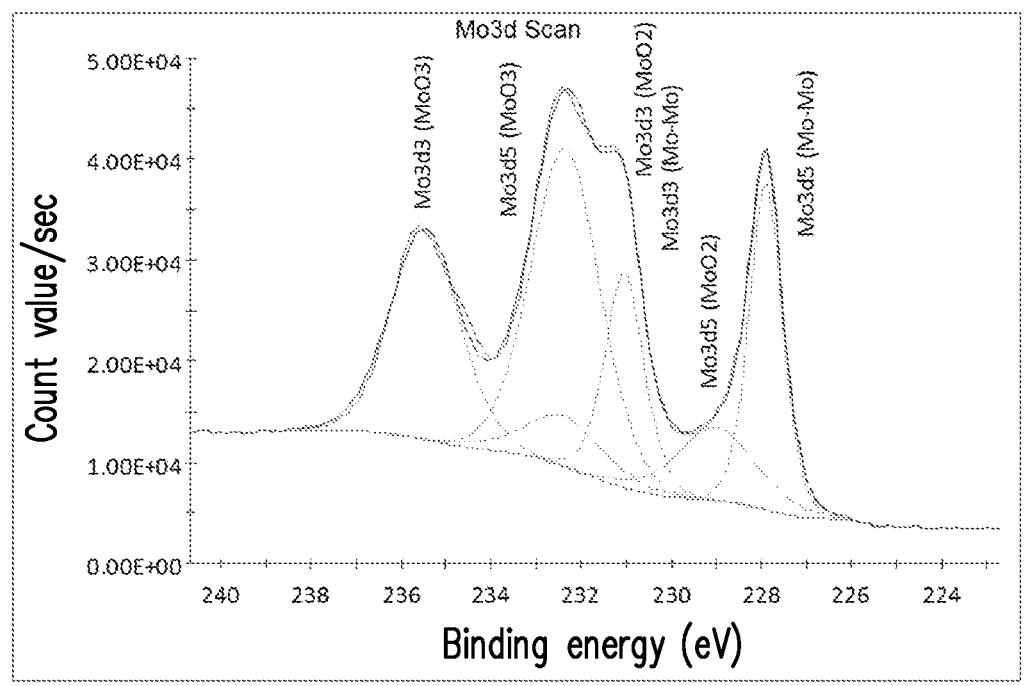
FIG. 4A is an X-ray photoelectron spectrogram of a surface of naturally oxidized molybdenum when the metal of a metal-containing layer is molybdenum.
Figure 4B:
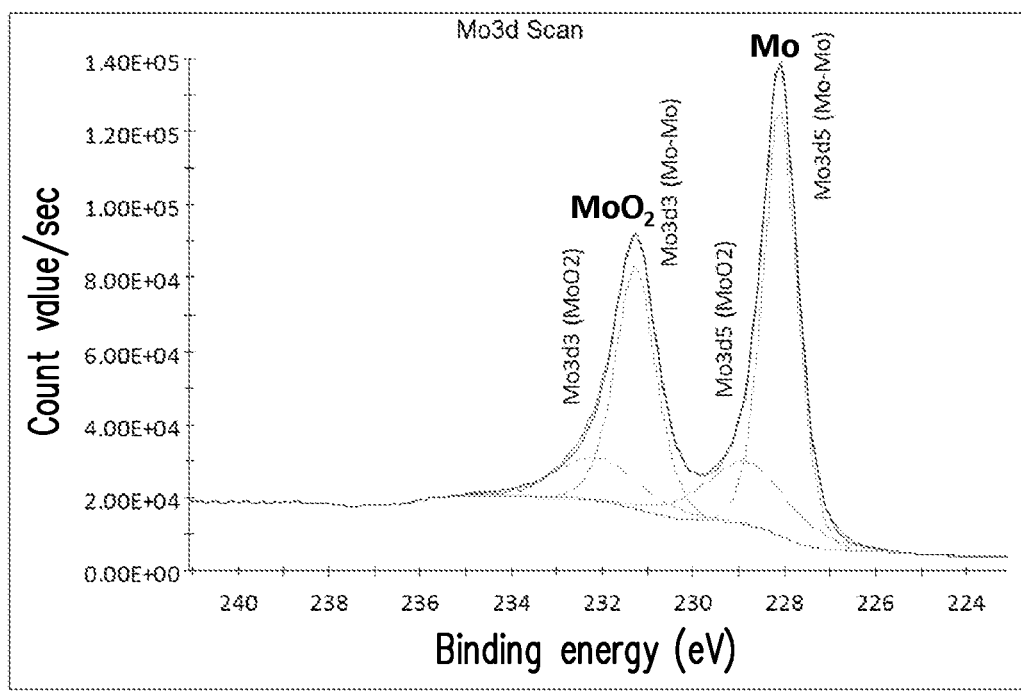
FIG. 4B is an X-ray photoelectron spectrogram of a first layer of a part of the metal-containing layer above a peeling interface when the metal of the metal-containing layer is molybdenum.
Figure 4C:
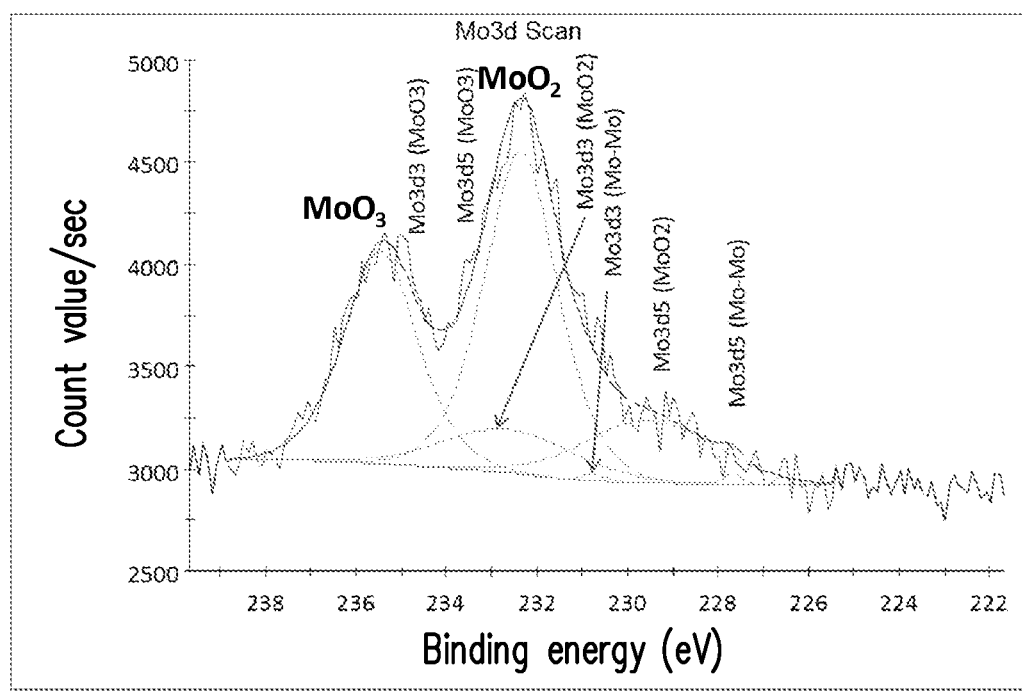
FIG. 4C is an X-ray photoelectron spectrogram of a first layer of a part of the metal-containing layer below the peeling interface when the metal of the metal-containing layer is molybdenum.

FIG. 4A is an X-ray photoelectron spectrogram of a surface of naturally oxidized molybdenum when the metal of the metal-containing layer is molybdenum. FIG. 4B is an X-ray photoelectron spectrogram of the first layer of a part of the metal-containing layer above the peeling interface when the metal of the metal-containing layer is molybdenum. FIG. 4C is an X-ray photoelectron spectrogram of the first layer of a part of the metal-containing layer below the peeling interface when the metal of the metal-containing layer is molybdenum. In FIG. 4A to FIG. 4C, the horizontal axis is the binding energy (eV) and the vertical axis is the count value/sec.

Referring to both FIG. 3B and FIG. 4A, when the metal of the metal-containing layer 120 is molybdenum (Mo) and has zero-valent molybdenum (Mo), the surface of the molybdenum naturally oxidizes. As indicated by the peak Mo3d3 ($MoO_3$) and the peak Mo3d5 ($MoO_3$) in FIG. 4A, it can be seen that the composition of the naturally oxidized molybdenum surface is mainly $MoO_3$. In addition, as indicated by the peak Mo3d3 (Mo—Mo) and the peak Mo3d5 (Mo—Mo) in FIG. 4A, it can be seen that the composition of the naturally oxidized molybdenum surface also includes molybdenum. Furthermore, as indicated by the peak Mo3d3 ($MoO_2$) and the peak Mo3d5 ($MoO_2$) in FIG. 4A, it can be seen that the composition of the naturally oxidized molybdenum surface also includes $MoO_2$.

Through calculation, the percentages of atoms between the peak Mo3d5 (Mo—Mo), the peak Mo3d5 ($MoO_2$), and the peak Mo3d5 ($MoO_3$) are 28.3%: 15.1%: 56.6%.

Referring to FIG. 3G to FIG. 3H and FIG. 4B, X-ray photoelectron spectroscopy analysis is performed on the first layer 122 of a part of the metal-containing layer 120 above the peeling interface F, and the X-ray photoelectron spectrogram as shown in FIG. 4B is obtained.

As indicated by the peak Mo3d3 ($MoO_2$) and the peak Mo3d5 ($MoO_2$) in FIG. 4B, it can be seen that the composition of the surface of the first layer 122 of a part of the metal-containing layer 120 above the peeling interface F is mainly $MoO_2$. In addition, as indicated by the peak Mo3d3 (Mo—Mo) and the peak Mo3d5 (Mo—Mo) in FIG. 4B, it can be seen that the composition of the surface of the first layer 122 of a part of the metal-containing layer 120 above the peeling interface F also includes molybdenum.

Through calculation, the percentages of atoms between the peak Mo3d5 (Mo—Mo) and the peak Mo3d5 ($MoO_2$) are 73.2%: 26.8%. That is to say, the composition of the first layer 122 of a part of the metal-containing layer 120 above the peeling interface F includes a metal with the oxidation number being zero and a metal oxide with a low oxidation number.

Referring to FIG. 3G to FIG. 3H and FIG. 4C, X-ray photoelectron spectroscopy analysis is performed on the first layer 122 of a part of the metal-containing layer 120 below the peeling interface F, and the X-ray photoelectron spectrogram as shown in FIG. 4C is obtained.

As indicated by the peak Mo3d3 ($MoO_3$) and the peak Mo3d5 ($MoO_3$) in FIG. 4C, it can be seen that the composition of the surface of the first layer 122 of a part of the metal-containing layer 120 below the peeling interface F is mainly $MoO_3$. In addition, as indicated by the peak Mo3d3 ($MoO_2$) and the peak Mo3d5 ($MoO_2$) in FIG. 4C, it can also be seen that the composition of the surface of the first layer 122 of a part of the metal-containing layer 120 below the peeling interface F also includes $MoO_2$. Furthermore, as indicated by the peak Mo3d3 (Mo—Mo) and the peak Mo3d5 (Mo—Mo) in FIG. 4C, it can also be seen that the composition of the surface of the first layer 122 of a part of the metal-containing layer 120 below the peeling interface F also includes a very small amount of molybdenum.

Through calculation, the percentages of atoms between the peak Mo3d5 (Mo—Mo), the peak Mo3d5 ($MoO_2$), and the peak Mo3d5 ($MoO_3$) are 0.6%: 24.6%: 74.8%. That is to say, the composition of the first layer 122 of a part of the metal-containing layer 120 below the peeling interface F includes a metal oxide with a high oxidation number.

It can be seen from the above contents of FIG. 3B and FIG. 4A, FIG. 3G to FIG. 3H and FIG. 4H, and FIG. 3G to FIG. 3H and FIG. 4C that, take molybdenum as an example, after the thermal process H (as shown in FIG. 3D) is performed, molybdenum oxides with different oxidation numbers are formed in the metal-containing layer 120 and then the peeling interface F is formed in the metal-containing layer 120, as compared with the surface of naturally oxidized molybdenum (the composition is mainly $MoO_3$).

It can be seen from FIG. 4B that the composition of the surface of the first layer 122 of a part of the metal-containing layer 120 above the peeling interface F is mainly $MoO_2$ (a metal oxide with a low oxidation number). Furthermore, it can be seen from FIG. 4C that the composition of the surface of the first layer 122 of a part of the metal-containing layer 120 below the peeling interface F is mainly $MoO_3$ (a metal oxide with a high oxidation number).

The above FIG. 4A to FIG. 4C illustrate an example where molybdenum is used as the material of the metal-containing layer 120. In the case of using other transition metals (vanadium, niobium, tantalum, tungsten, rhenium, and chromium) as the metal-containing layer 120, the above-described X-ray photoelectron spectroscopy analysis may also be performed to obtain the composition state of the metal oxide of each layer in the metal-containing layer 120.

Figure 5:
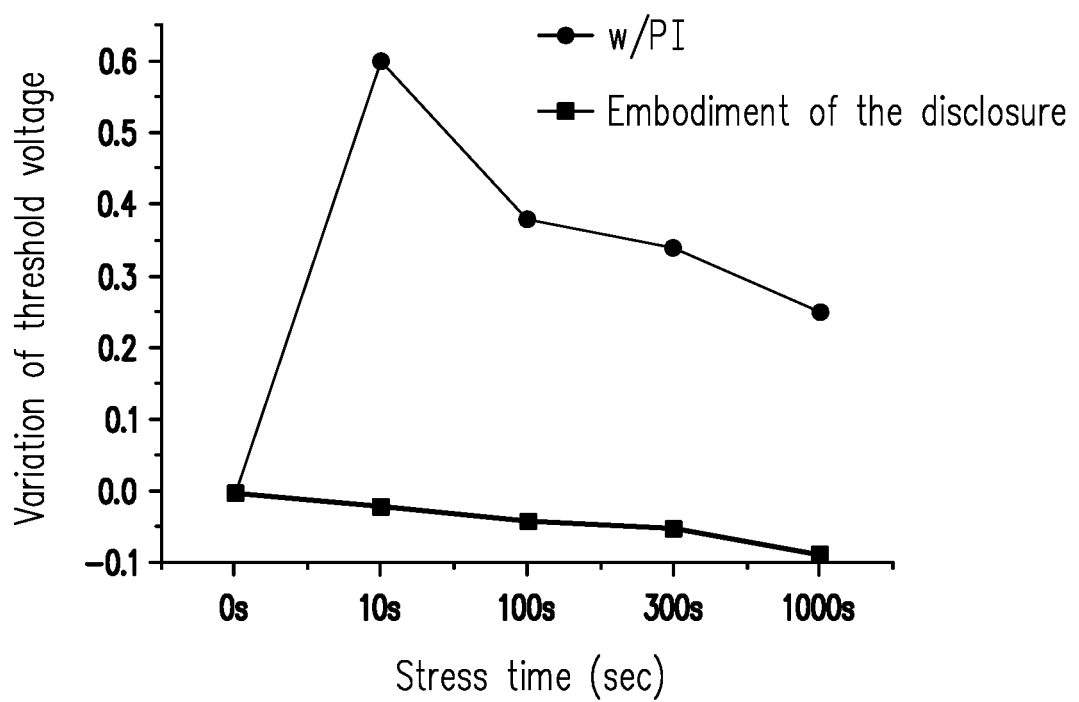
FIG. 5 is a graph showing that the variation of the threshold voltage (Vth shift) of the electronic component layer of the flexible device array substrate according to an embodiment of the disclosure changes with the stress time, and showing that the variation of the threshold voltage of the electronic component layer of a conventional flexible device array substrate using a flexible substrate changes with the stress time.

FIG. 5 is a graph showing that the variation of a threshold voltage (Vth shift) of the electronic component layer of the flexible device array substrate according to an embodiment of the disclosure changes with a stress time, and showing that the variation of the threshold voltage of the electronic component layer of a conventional flexible device array substrate using a flexible substrate changes with the stress time. In FIG. 5, the vertical axis is the variation of the threshold voltage and the horizontal axis is the stress time (sec).

Referring to FIG. 5, under the conditions that the temperature is 60° and the gate voltage V gate and the drain voltage V drain are both −20V, the "characteristic curve of gate voltage vs. drain current (Id-Vg)" is measured respectively at 0 sec, 10 sec, 100 sec, 300 sec, and 1000 sec. It can be seen that in the flexible device array substrate of the embodiment of the disclosure, the electronic component layer has a stable threshold voltage.

In contrast to the embodiment of the disclosure, in the conventional flexible device array substrate using a flexible substrate (for example, polyimide PI), the threshold voltage of the electronic component layer varies drastically with the stress time, and the electronic component layer has an unstable threshold voltage.

It can be seen from the above that the active device (for example, a thin film transistor TFT) of the electronic component layer in the flexible device array substrate of the embodiment of the disclosure after undergoing the stress test has better electrical performance than the active device (for example, a thin film transistor TFT) of the electronic component layer in the conventional flexible device array substrate using a flexible substrate (for example, polyimide PI) after undergoing the stress test.

Figure 6A:
FIG. 6A to FIG. 6J are schematic cross-sectional views showing a manufacturing method of the flexible device array substrate according to an embodiment of the disclosure.

FIG. 6A to FIG. 6J are schematic cross-sectional views showing a manufacturing method of the flexible device array substrate according to an embodiment of the disclosure. Referring to FIG. 6A, first, the substrate 110 is provided. The substrate 110 is, for example, a glass substrate or a non-glass substrate deposited with an oxide layer. As described above, the substrate 110 provides oxygen atoms for oxidizing the metal of the metal-containing layer 120 which is provided later.

Figure 6B:
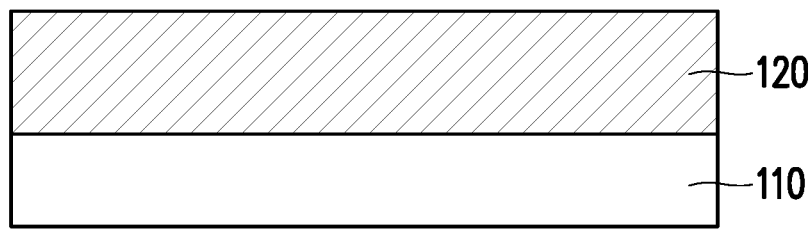

Referring to FIG. 6B, the metal-containing layer 120 is formed on the substrate 110. The metal of the metal-containing layer 120 is, for example, a transition metal having multiple oxidation states. In an embodiment, the metal of the metal-containing layer 120 is selected from molybdenum, vanadium, niobium, tantalum, tungsten, rhenium, chromium, and a combination thereof.

In an embodiment, the metal of the metal-containing layer 120 is, for example, molybdenum oxide (MoO) with divalent molybdenum ($Mo^{2+}$). In another embodiment, the metal of the metal-containing layer 120 is, for example, molybdenum with zero-valent molybdenum (Mo). That is, the metal-containing layer 120 includes, for example, a metal with the oxidation number being zero, or a combination of a metal with the oxidation number being zero and a metal oxide of a metal with a low oxidation number.

Figure 6C:
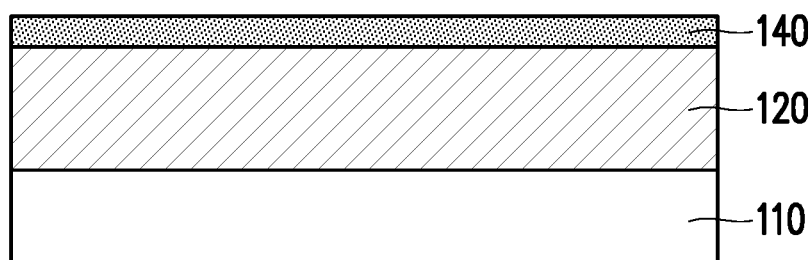

Referring to FIG. 6C, the barrier layer 140 is formed on the metal-containing layer 120. The barrier layer 140 uses, for example, an inorganic layer stack of nitrogen oxide. The barrier layer 140 prevents the metal-containing layer 120 located below from affecting the electrical properties of other layers formed above.

Figure 6D:
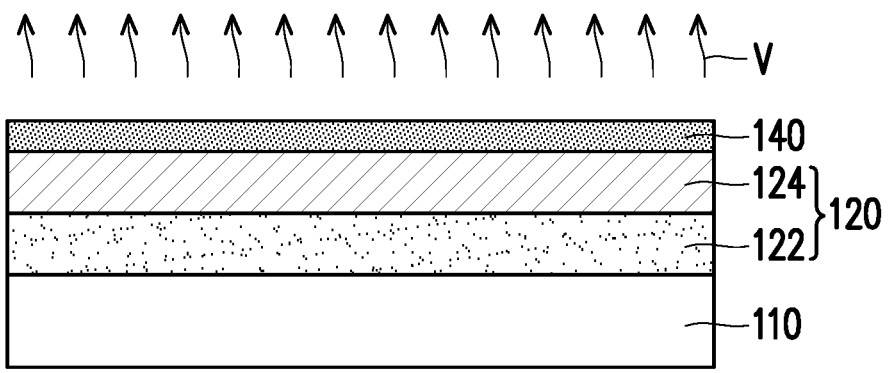
Figure 6E:
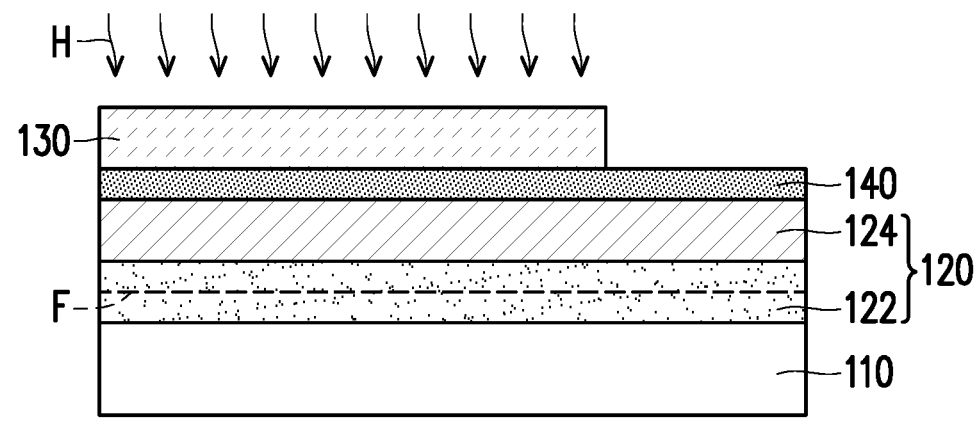

Referring to FIG. 6D, it is noted that, in the embodiment, a rapid thermal annealing process V is performed before the step of forming the electronic component layer 130 as shown in FIG. 6E. With the rapid thermal annealing process V, the hydrogen in each layer is removed, which is beneficial to improve the electronic characteristics of the electronic component layer 130 to be manufactured subsequently.

Referring to FIG. 6E, it is noted that, in the embodiment, the thermal process H is performed in the step of forming the electronic component layer 130. The electronic component layer 130 is, for example, a component layer of a low temperature poly-silicon (LTPS) thin film transistor. That is, the metal-containing layer 120 is heated simultaneously using the heating step for forming the electronic component layer 130.

Thus, the metal-containing layer 120 is oxidized with the oxygen atoms from the substrate 110 to form the first layer 122 and the second layer 124. The first layer 122 is located on the side close to the substrate 110. The first layer contains the first metal oxide 122A to form the peeling interface F in the first layer 122. The second layer 124 is located on the side away from the substrate 110. The second layer 124 contains the second metal oxide 124A. The oxidation number of the metal in the second metal oxide 124A is smaller than the oxidation number of the metal in the first metal oxide 122A. At this point, the flexible device array substrate 101 as shown in FIG. 6E is completed.

Similarly, the temperature range of the thermal process H is, for example, 350° C. to 650° C. In another embodiment, the temperature range of the thermal process H is, for example, 500° C. to 650° C. In the embodiments of FIG. 6A to FIG. 6E, the step of performing the thermal process H may be omitted to further simplify the manufacturing process of the flexible device array substrate 101.

Further, please refer to FIG. 6A to FIG. 6E and FIG. 6F to understand the manufacturing process of the flexible device array substrate 103 according to an embodiment of the disclosure.

Figure 6F:
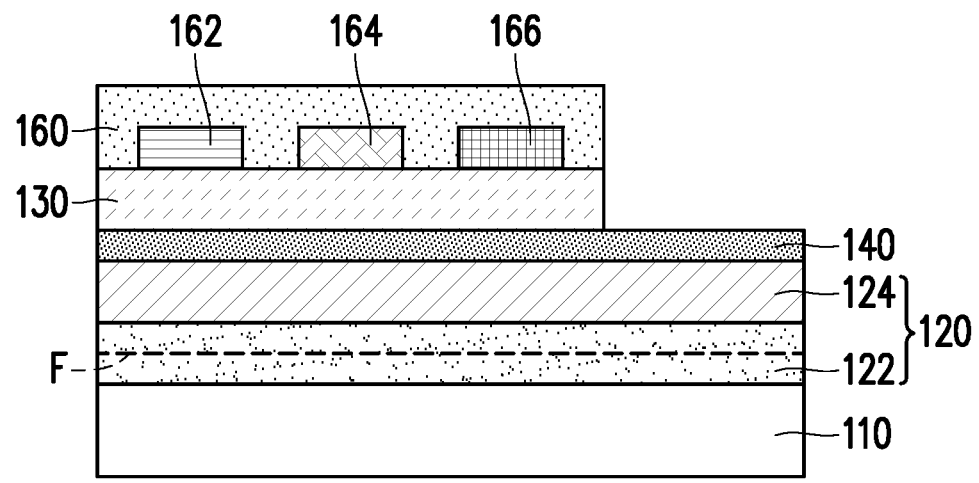

After the steps of FIG. 6A to FIG. 6E, as shown in FIG. 6F, the display element layer 160 is further formed on the electronic component layer 130. The display element layer 160 includes, for example, the first light emitting element 162, the second light emitting element 164, and the third light emitting element 166 disposed adjacent to each other. At this point, the flexible device array substrate 103 is completed. The technical content of the display element layer 160 has been described in the paragraphs related to FIG. 3F above, and will not be repeated here.

In addition, please refer to FIG. 3A to FIG. 3E and FIG. 3F to FIG. 3G to understand the manufacturing process of the flexible device array substrate 104 according to an embodiment of the disclosure.

Figure 6G:
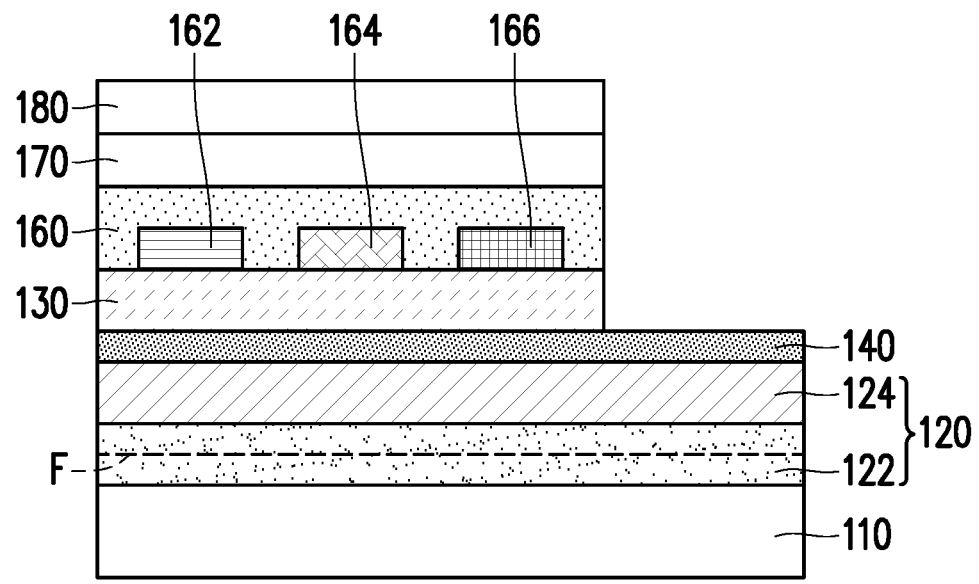

After the steps of FIG. 6A to FIG. 6F, as shown in FIG. 6G, the optical clear adhesive layer 170 and the cover lens layer 180 are sequentially formed on the display element layer 160. At this point, the flexible device array substrate 104 is completed. The technical contents of the optical clear adhesive layer 170 and the cover lens layer 180 have been described in the paragraphs related to FIG. 3G above, and will not be repeated here.

Figure 6H:
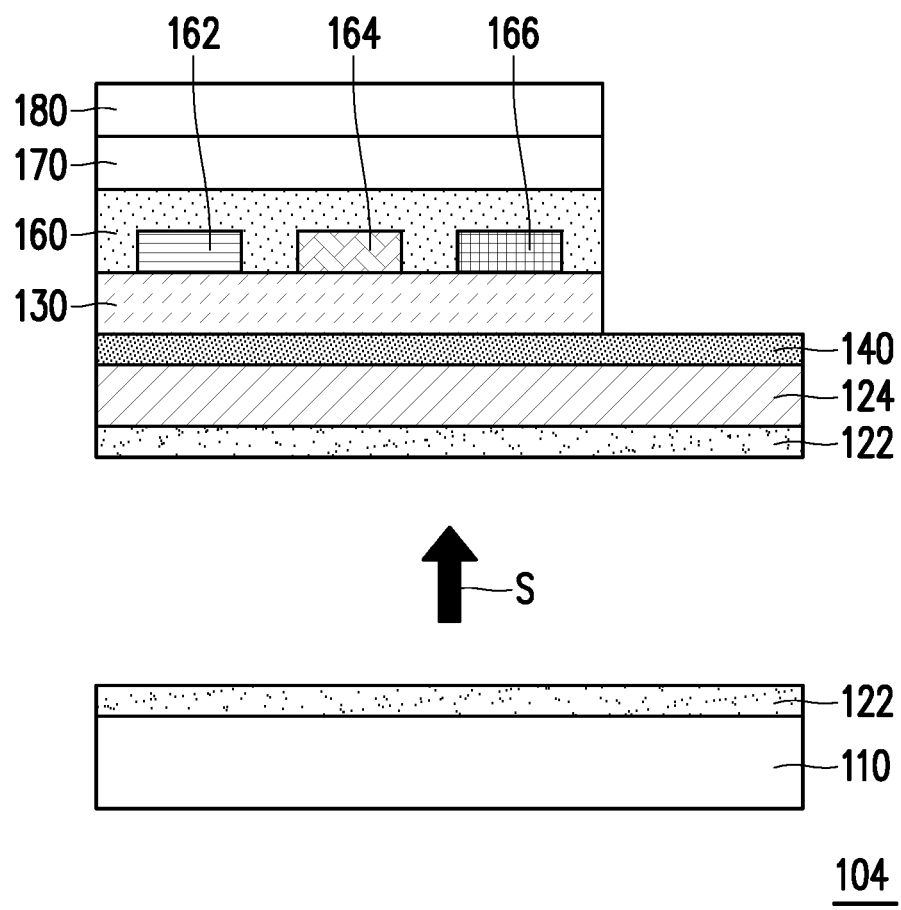

Referring to FIG. 6H, the peeling operation S is further performed after the flexible device array substrate 104 is completed. A part of the first layer 122 and the substrate 110 are separated from each other at the peeling interface F (as shown in FIG. 6G). It is noted that the peeling operation S may also be performed after the flexible device array substrate 101 as shown in FIG. 6E is completed, or the peeling operation S may also be performed after the flexible device array substrate 103 as shown in FIG. 6F is completed.

In addition, please refer to FIG. 6A to FIG. 6H and FIG. 6I to understand the manufacturing process of the flexible device array substrate 105 according to an embodiment of the disclosure.

Figure 6I:
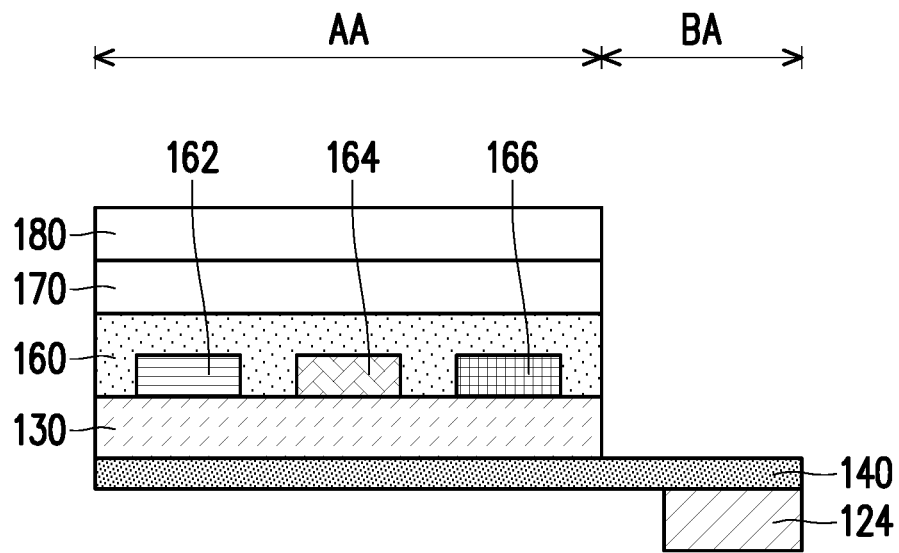

After the steps of FIG. 6A to FIG. 6H, referring to FIG. 6I, a patterning process is further performed to leave the pattern of the second layer 124 at least in a bent area BA of the flexible device array substrate 105. The patterning process is, for example, a lithography step combined with an etching step. Disposing the pattern (metal) of the second layer 124 in the bent area BA enhances the bending toughness of the bent area BA of the flexible device array substrate 105.

Figure 6J:
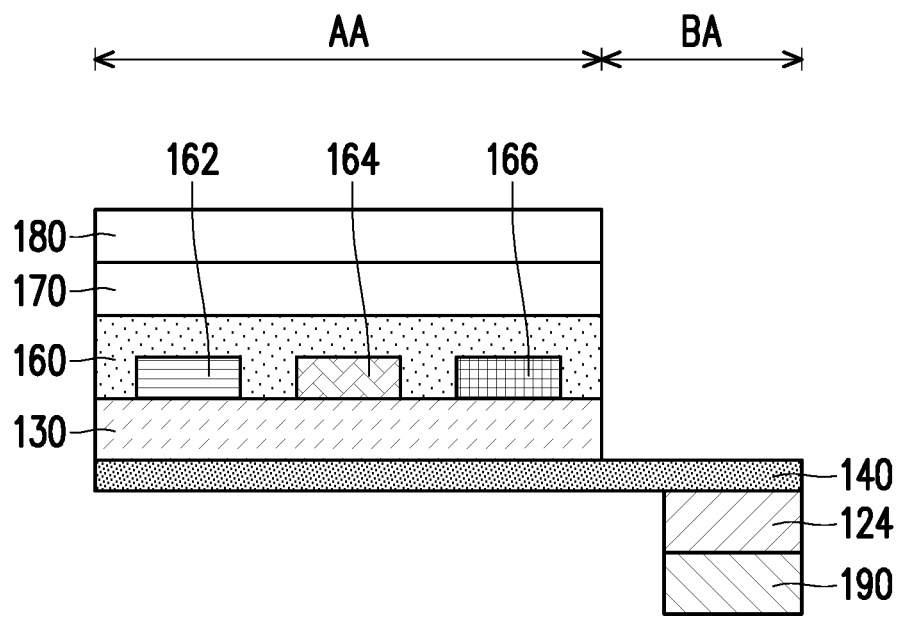

Further, please refer to FIG. 6J to understand the manufacturing process of the flexible device array substrate 106 according to an embodiment of the disclosure. As shown in FIG. 6H, a thickened pattern layer 190 is further formed on the pattern of the second layer 124. Here, the pattern of the second layer 124 may be used as a seed layer for electroplating, and the thickened pattern layer 190 may be formed by performing a plating method to partially thicken the metal layer in areas that require structural protection or electromagnetic shielding protection. The thickness of the thickened pattern layer 190 is, for example, 1 μm to 1000 μm, and the commonly used thickness is less than 100 μm. For example, a thickened pattern layer 190 of copper having a thickness of 40 μm is formed by using copper as the plated metal.

FIG. 7A to FIG. 7E are schematic views of the cross-sectional structures of the metal-containing layer according to embodiments of the disclosure. In the embodiments of FIG. 7A to FIG. 7E, the substrate 110, the electronic component layer 130, and the barrier layer 140 are shown together to facilitate understanding of the structure of the metal-containing layer 120 in the layer structure.

Referring to FIG. 7A to FIG. 7E, the total thickness of the metal-containing layer 120 is, for example, 5 nm to 2000 nm, and the commonly used thickness is 100 nm to 1000 nm.

In an embodiment, the metal-containing layer 120 includes a single-layer structure, that is, only a single layer M1. The metal-containing layer 120 is, for example, a metal layer of molybdenum, vanadium, niobium, tantalum, tungsten, rhenium, or chromium including the single layer M1. In an embodiment, referring to FIG. 7A, the metal-containing layer 120 is, for example, a metal layer of molybdenum (Mo) including the single layer M1.

Referring to FIG. 7B to FIG. 7E, in an embodiment, the metal-containing layer 120 includes a multi-layer structure.

Referring to FIG. 7B, the metal-containing layer 120 includes two layers M1 and M2. The layer M1 in contact with the substrate 110 is, for example, a metal layer of molybdenum, vanadium, niobium, tantalum, tungsten, rhenium, or chromium; and the other layer M2 may be formed of different metals according to the stress requirements, such as a metal layer of aluminum. Aluminum is a metal that is not miscible with molybdenum. The internal stress of the layer structure of the metal-containing layer 120 is adjustable by the difference in coefficient of thermal expansion (CTE) between the layer M1 of molybdenum and the layer M2 of aluminum.

Referring to FIG. 7C, the metal-containing layer 120 includes three layers M1, M2, and M3. The metal materials of M1/M2/M3 form, for example, a multi-layer structure of Mo/Al/Mo.

Referring to FIG. 7D, the metal-containing layer 120 includes four layers M1, M2, M3, and M4. The metal materials of M1/M2/M3/M4 form, for example, a multi-layer structure of Mo/Al/Mo/Al.

Referring to FIG. 7E, the metal-containing layer 120 includes five layers M1, M2, M3, M4, and M5. The metal materials of M1/M2/M3/M4/M5 form, for example, a multi-layer structure of Mo/Al/Mo/Al/Mo. In addition, the metal of the layer M5 may be a metal having a coefficient of thermal expansion corresponding to the barrier layer 140.

Moreover, regarding the types of the metal materials, the metal to be selected may be suitable for wet etching or dry etching, for example, which is advantageous for the subsequent patterning process. Metals suitable for wet etching include, for example, molybdenum, chromium, aluminum, niobium, and neodymium. Metals suitable for dry etching include, for example, titanium.

Based on the above, the metal-containing layer 120 with the multi-layer structures of FIG. 7B to FIG. 7E reduces the stress of the plating film, increases the overall thickness of the metal-containing layer 120, and suppresses damage caused by foreign matters in the layers M1 to M5.

Figure 8A:
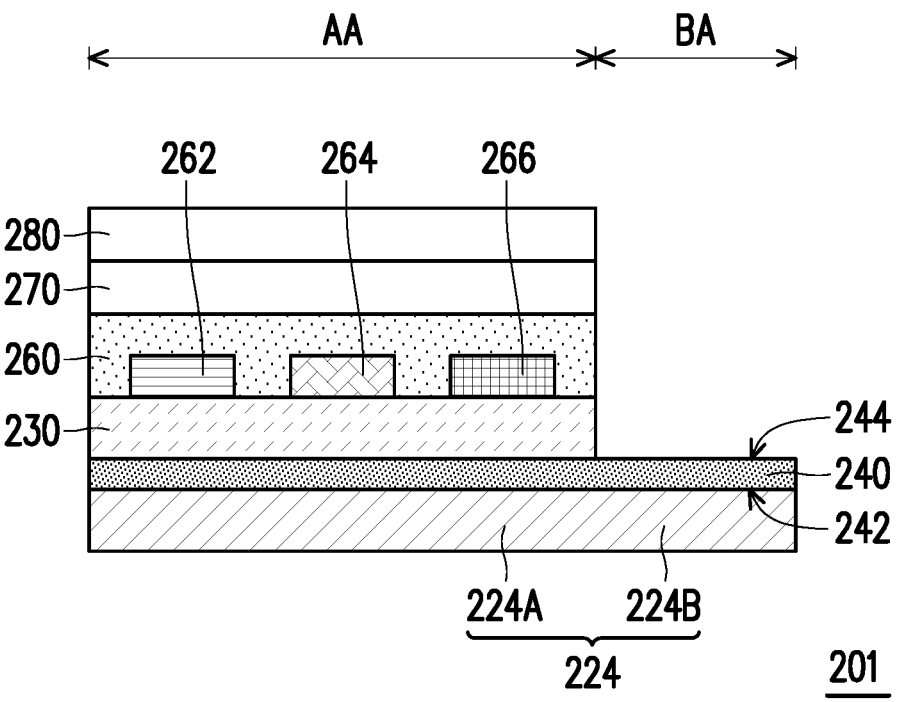
FIG. 8A to FIG. 8B are schematic cross-sectional views of the flexible device array substrate according to an embodiment of the disclosure.
Figure 8B:
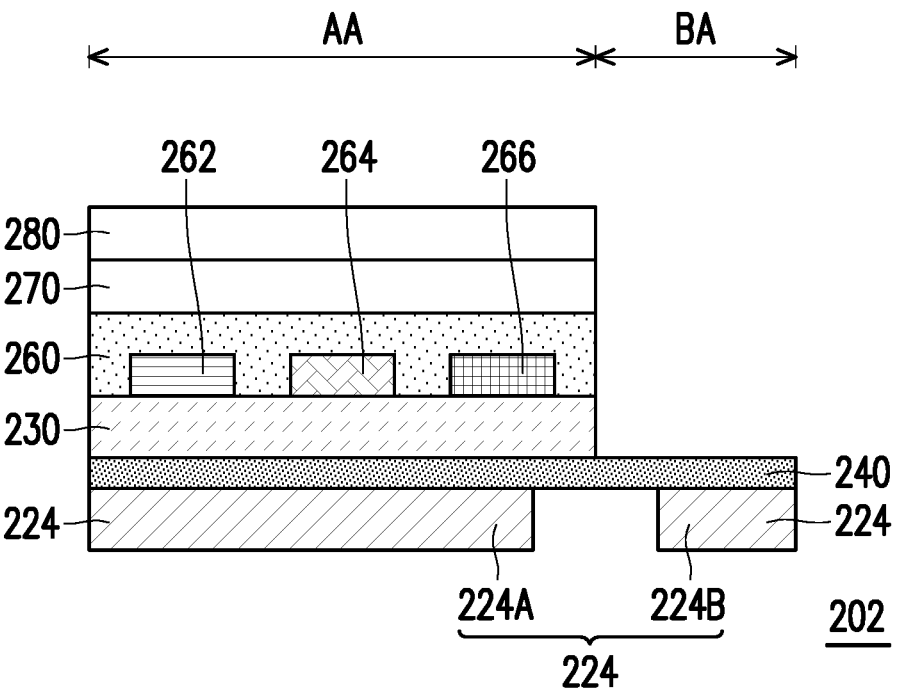

FIG. 8A to FIG. 8B are schematic cross-sectional views of the flexible device array substrate according to an embodiment of the disclosure. The metal-containing layer 120 (first layer 122) of the flexible device array substrate 104 obtained after the peeling operation S of FIG. 3H or FIG. 6H may be further processed to obtain the flexible device array substrate 201 shown in FIG. 8A or the flexible device array substrate 202 shown in FIG. 8B.

In detail, referring to FIG. 8A first, the flexible device array substrate 201 of the embodiment includes a display area AA and a bent area BA located on a side of the display area AA. The flexible device array substrate 201 includes a first film 240, a metal-containing layer 224, and an electronic component layer 230. The metal-containing layer 224 is disposed on a first surface 242 of the first film 240, and the metal-containing layer 224 is located at least in the bent area BA. The electronic component layer 230 is disposed on a second surface 244 of the first film 240, and the second surface 244 and the first surface 242 are opposite to each other.

Referring to FIG. 8A, the first film 240 is, for example, a barrier layer so that the metal-containing layer 224 and the electronic component layer 230 are not electrically connected to each other. The metal-containing layer 224 is used to improve the toughness and flexibility of the flexible device array substrate 201.

In the embodiment, the flexible device array substrate 201 further includes a display element layer 260 disposed on the electronic component layer 230. The display element layer 260 includes a first light emitting element 262, a second light emitting element 264, and a third light emitting element 266 disposed adjacent to each other. The first light emitting element 262 is, for example, a red light emitting diode, the second light emitting element 264 is, for example, a green light emitting diode, and the third light emitting element 266 is, for example, a blue light emitting diode. In addition, thin film encapsulation (TFE) may be used to encapsulate the first light emitting element 262, the second light emitting element 264, and the third light emitting element 266, so that the display element layer 260 is bendable.

In addition, in the embodiment, the flexible device array substrate 201 further includes an optical clear adhesive layer 270 disposed on the display element layer 260; and a cover lens layer 280 disposed on the optical clear adhesive layer 270. With the optical clear adhesive layer 270 and the cover lens layer 280, the optical properties of the display element layer 260 are improved and the display effect of the display element layer 260 is optimized.

Referring to FIG. 8A, the metal-containing layer 224 includes, for example, a first part 224A and a second part 224B connected to each other. The first part 224A is disposed in the display area AA. The second part 224B is disposed in the bent area BA.

Further, referring to FIG. 8B, in the flexible device array substrate 202 of the embodiment, the metal-containing layer 224 includes, for example, the first part 224A and the second part 224B separated from each other. The first part 224A is disposed in the display area AA. The second part 224B is disposed in the bent area BA. In the embodiment, the metal-containing layer 224 is segmented for processing so that the second part 224B functions as a fan-out wiring.

Figure 9A:
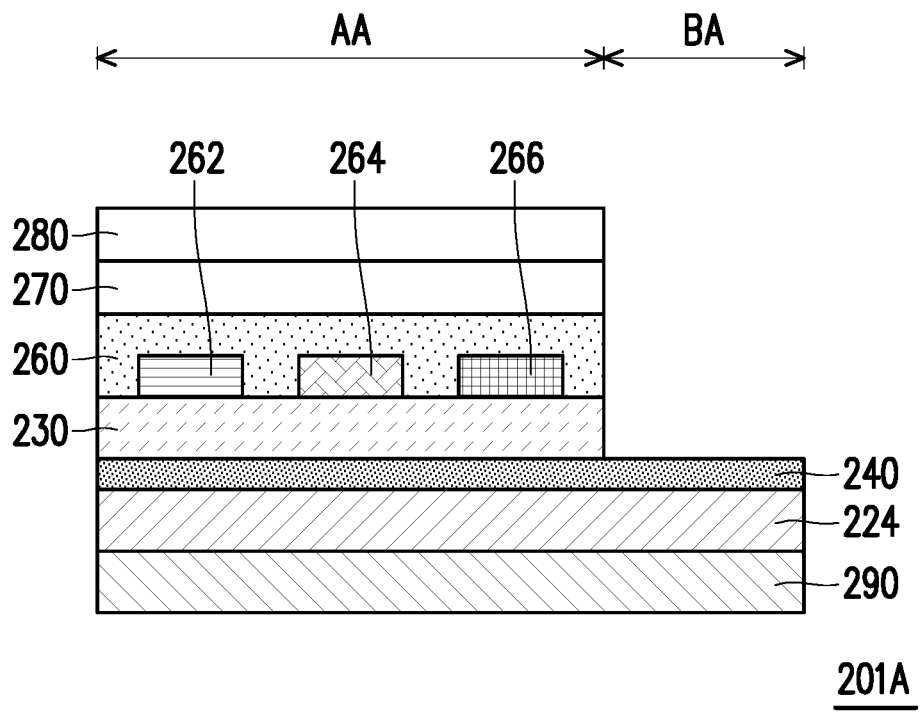
FIG. 9A to FIG. 9B are schematic cross-sectional views of the flexible device array substrate according to an embodiment of the disclosure.
Figure 9B:
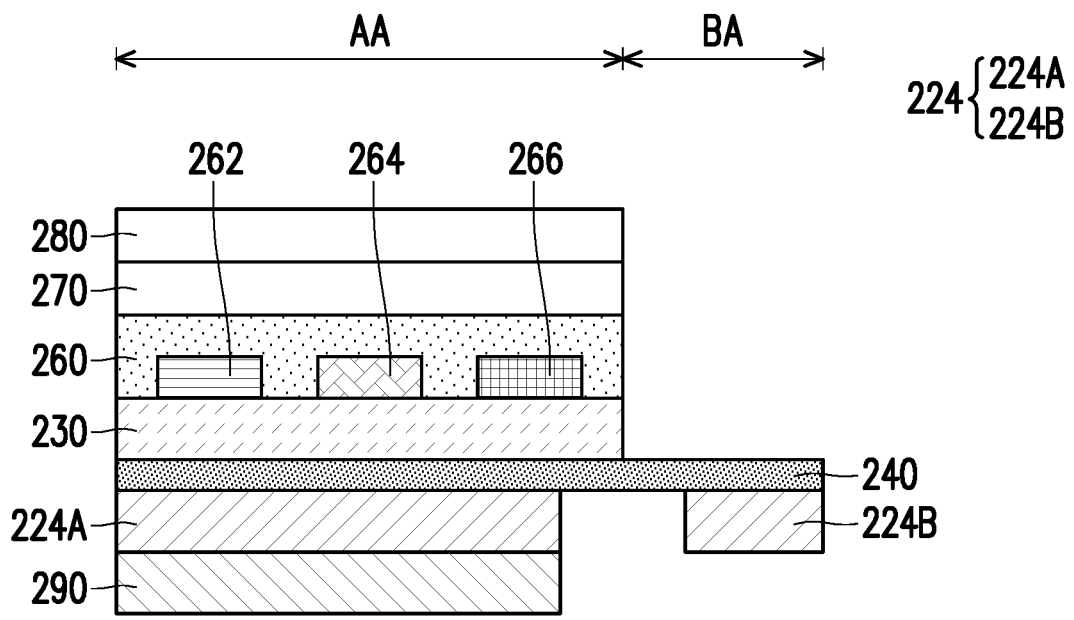

FIG. 9A to FIG. 9B are schematic cross-sectional views of the flexible device array substrate according to an embodiment of the disclosure. Referring to FIG. 9A, the flexible device array substrate 201A of the embodiment is based on the flexible device array substrate 201 of FIG. 8A, and further includes a thickened pattern layer 290 disposed on the metal-containing layer 224.

Referring to FIG. 9B, the flexible device array substrate 202A of the embodiment is based on the flexible device array substrate 202 of FIG. 8B, and further includes the thickened pattern layer 290 disposed on the first part 224A of the metal-containing layer 224.

In the embodiments of FIG. 9A and FIG. 9B, the pattern of the metal-containing layer 224 may be used as a seed layer for electroplating. The thickened pattern layer 290 may be formed by performing a plating method to partially thicken the metal layer in areas that require structural protection or electromagnetic shielding protection. The thickness of the thickened pattern layer 290 is, for example, 1 μm to 1000 μm, and the commonly used thickness is less than 100 μm. For example, a thickened pattern layer 290 of copper having a thickness of 40 μm is formed by using copper as the plated metal.

Figure 10A:
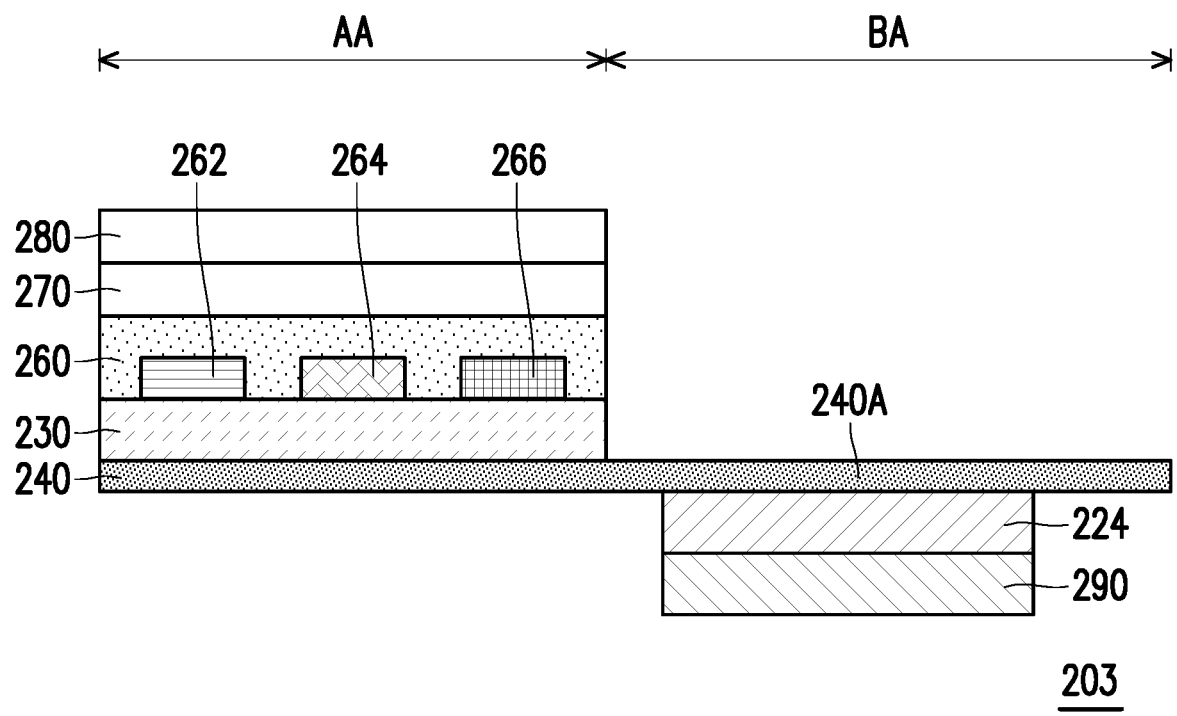
FIG. 10A to FIG. 10C are schematic cross-sectional views of the flexible device array substrate according to an embodiment of the disclosure.
Figure 10B:
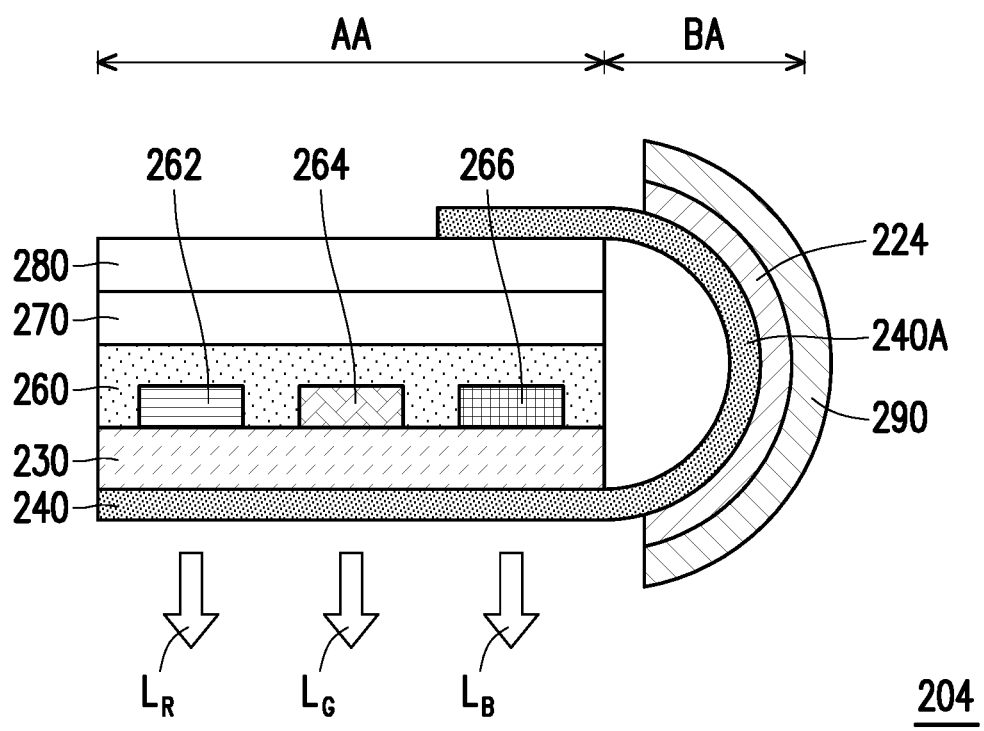
Figure 10C:
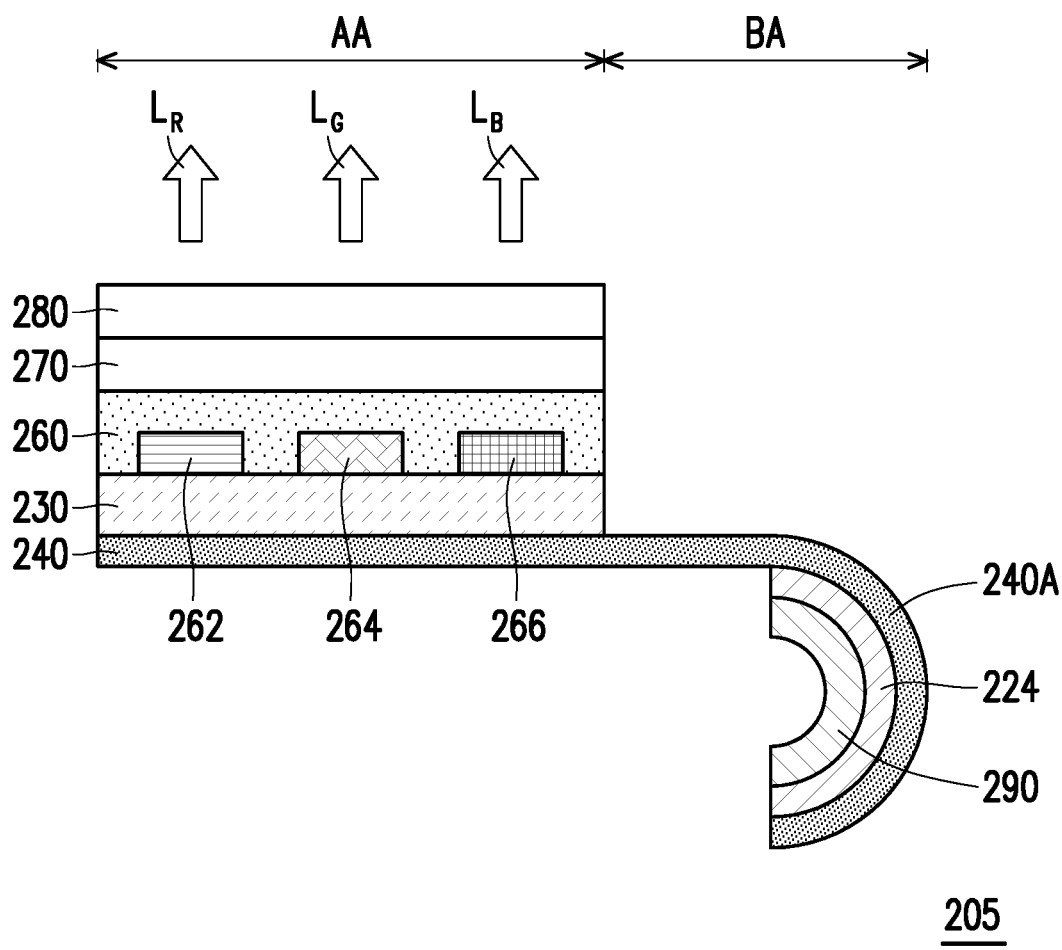

FIG. 10A to FIG. 10C are schematic cross-sectional views of the flexible device array substrate according to an embodiment of the disclosure. Referring to FIG. 10A, in the flexible device array substrate 203 of the embodiment, the first film 240 includes a bent part 240A. The metal-containing layer 224 is disposed on the bent part 240A. The thickened pattern layer 290 is further disposed on the metal-containing layer 224 located on the bent part 240A. The flexible device array substrate 203 of FIG. 10A shows the unbent state.

Referring to FIG. 10B and FIG. 10C, it can be seen that the bending direction of the bent part 240A is opposite to the light emitting directions $L_R$, $L_G$, and $L_B$ of the first light emitting element 262, the second light emitting element 264, and the third light emitting element 266.

Referring to FIG. 10B, in the flexible device array substrate 204 of the embodiment, the light emitting directions $L_R$, $L_G$, and $L_B$ of the first light emitting element 262, the second light emitting element 264, and the third light emitting element 266 are directed downward in FIG. 10B, and the bent part 240A is bent upward in FIG. 10B.

Referring to FIG. 10C, in the flexible device array substrate 205 of the embodiment, the light emitting directions $L_R$, $L_G$, and $L_B$ of the first light emitting element 262, the second light emitting element 264, and the third light emitting element 266 are directed upward in FIG. 10C, and the bent part 240A is bent downward in FIG. 10C.

Referring to FIG. 10B and FIG. 10C again, after bending, the thickened pattern layer 290 is further disposed on the metal-containing layer 224 on the bent part 240A as a protective structure or an electromagnetic shielding structure at the position of the bent part 240A. After the first film 240 is bent, the thickened pattern layer 290 is disposed by a plating method or the like. Thus, the neutral axis of the first film 240 is not changed, which is beneficial to the stability of the overall structure.

Figure 11:
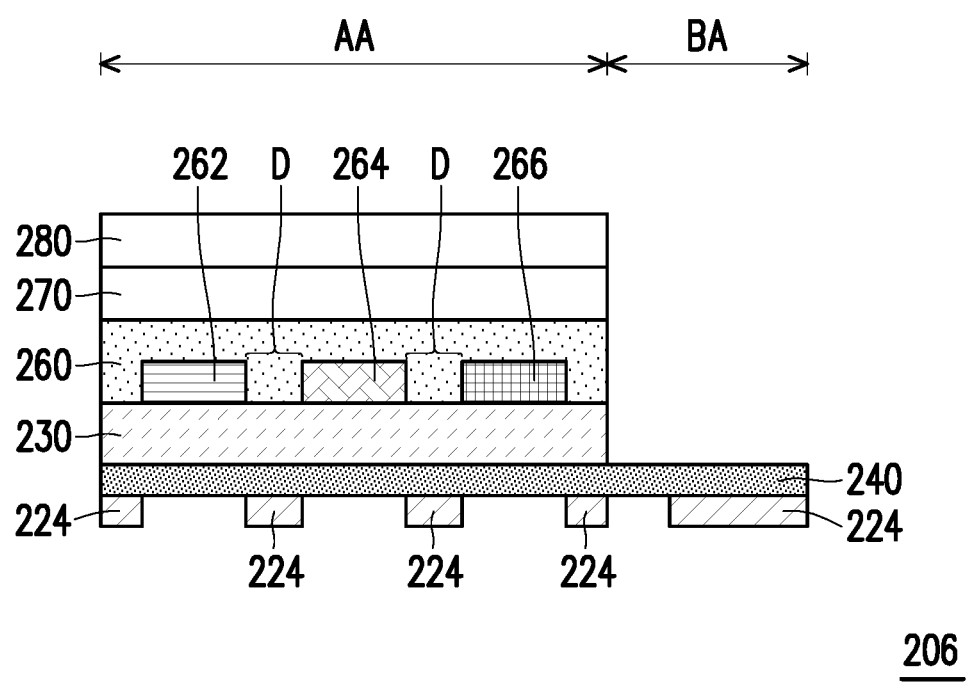
FIG. 11 is a schematic cross-sectional view of the flexible device array substrate according to an embodiment of the disclosure.

FIG. 11 is a schematic cross-sectional view of the flexible device array substrate according to an embodiment of the disclosure. Referring to FIG. 11, in the flexible device array substrate 206 of the embodiment, the pattern of the metal-containing layer 224 is disposed corresponding to intervals D between the first light emitting element 262, the second light emitting element 264, and the third light emitting element 266. Thus, in the flexible device array substrate 206, the light permeability of the light emitted by the first light emitting element 262, the second light emitting element 264, and the third light emitting element 266 is improved, and the strength of the overall structure is improved.

Figure 12A:
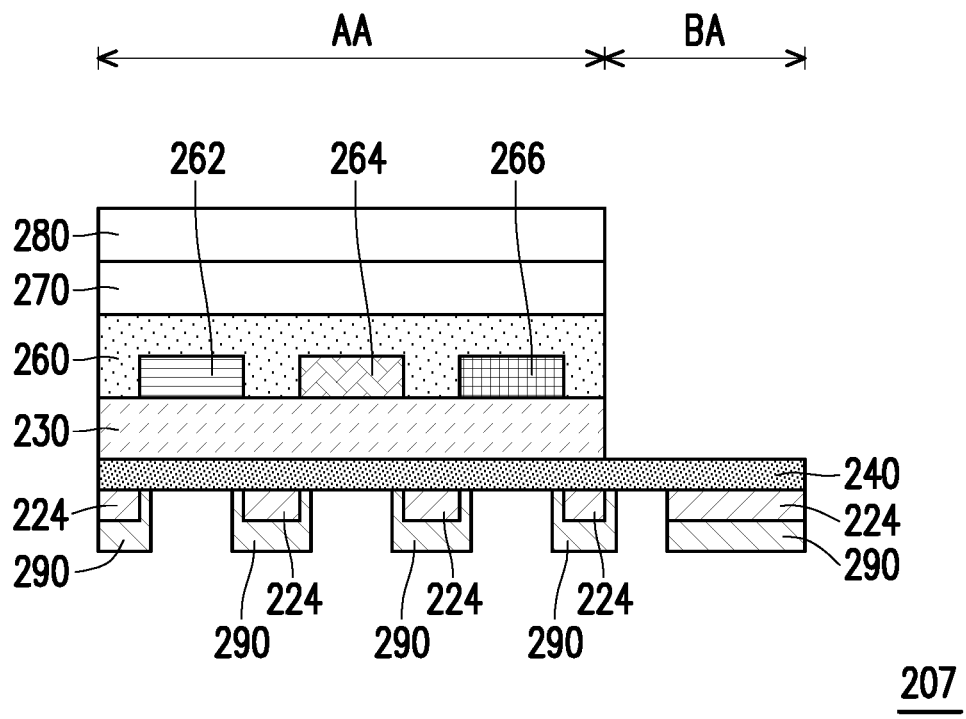
FIG. 12A is a schematic cross-sectional view of the flexible device array substrate according to an embodiment of the disclosure.
Figure 12B:
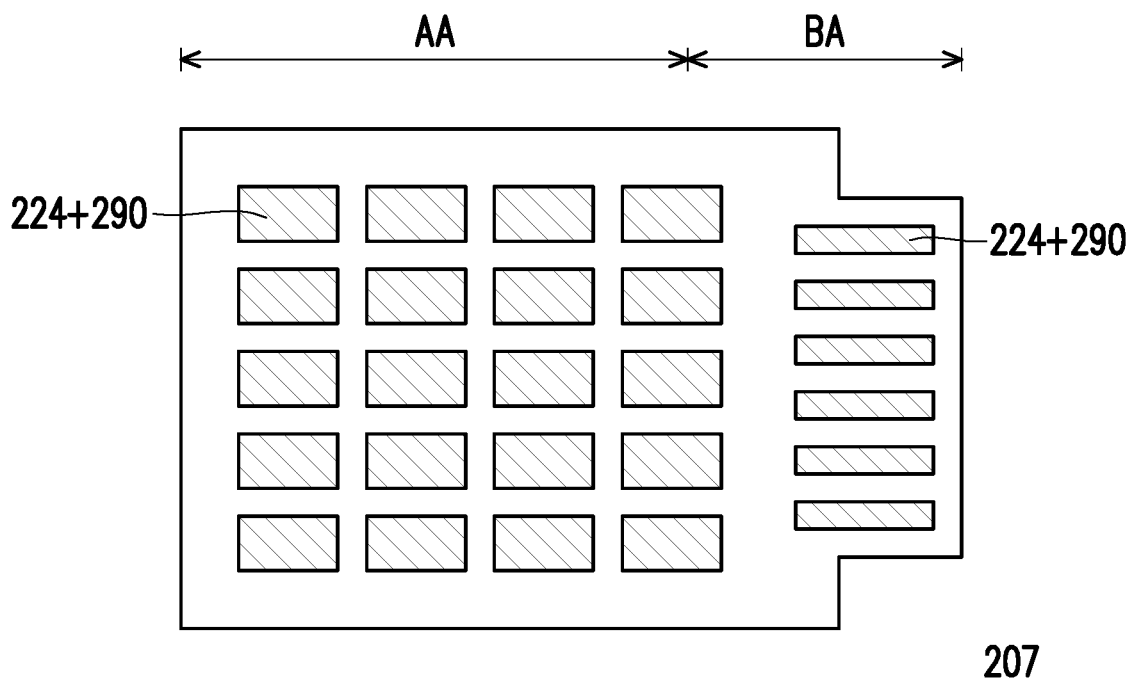
FIG. 12B is a schematic bottom view of the flexible device array substrate of FIG. 12A.

FIG. 12A is a schematic cross-sectional view of the flexible device array substrate according to an embodiment of the disclosure. FIG. 12B is a schematic bottom view of the flexible device array substrate of FIG. 12A. Referring to FIG. 12A, the flexible device array substrate 207 of the embodiment is based on the flexible device array substrate 206 of FIG. 11, and further includes the thickened pattern layer 290 disposed on the pattern of the metal-containing layer 224.

Similarly, in the embodiments of FIG. 12A and FIG. 12B, the pattern of the metal-containing layer 224 may be used as a seed layer for electroplating. The thickened pattern layer 290 may be formed by performing a plating method to partially thicken the metal layer in areas that require structural protection or electromagnetic shielding protection. The thickness of the thickened pattern layer 290 is, for example, 1 μm to 1000 μm, and the commonly used thickness is less than 100 μm. For example, a thickened pattern layer 290 of copper having a thickness of 40 μm is formed by using copper as the plated metal.

Figure 13:
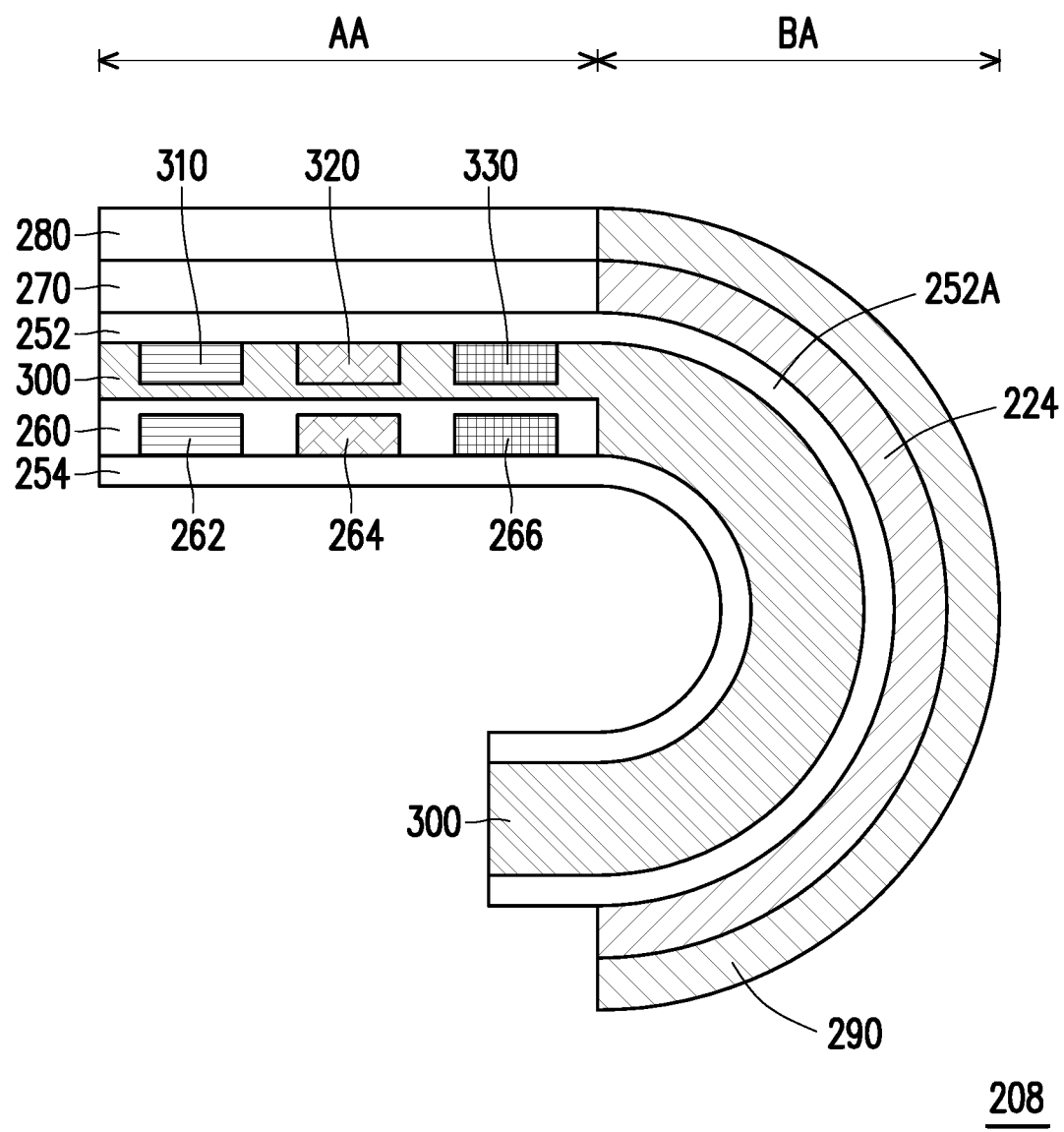
FIG. 13 is a schematic cross-sectional view of the flexible device array substrate according to an embodiment of the disclosure.

FIG. 13 is a schematic cross-sectional view of the flexible device array substrate according to an embodiment of the disclosure. Referring to FIG. 13, in addition to the first film 252, the metal-containing layer 224, the electronic component layer (not shown), the display element layer 260 (including the first light emitting element 262, the second light emitting element 264, and the third light emitting element 266), the optical clear adhesive layer 270, and the cover lens layer 280, the flexible device array substrate 208 of the embodiment further includes a second film 254 carrying the display element layer 260; and a color filter pattern layer 300 disposed corresponding to the display element layer 260. The color filter pattern layer 300 includes a first filter pattern 310, a second filter pattern 320, and a third filter pattern 330 disposed adjacent to each other; and the thickened pattern layer 290 disposed on the metal-containing layer 224 located on the bent part 252A of the first film 252. The color filter pattern layer 300 is located between the first film 252 and the second film 254, and the first film 252 and the second film 254 are flexible substrates.

The flexible device array substrate 208 of the embodiment has two layers of flexible substrates, and the flexible substrate may be a polyimide (PI) substrate. In addition, the metal-containing layer 224 is disposed on the bent part 252A, and the metal-containing layer 224 is used as a seed layer for electroplating to form the thickened pattern layer 290.

In summary, in the flexible device array substrate and the manufacturing method thereof according to the disclosure, a layer of metal oxide layer with a high oxidation number is formed between the substrate and the metal of the metal-containing layer by a thermal process. In this layer, a peeling interface is formed due to the weak cohesion force of the metal oxide. A part of the first layer and the substrate can be easily separated at the peeling interface, so as to easily remove the second layer of the metal-containing layer together with the electronic component layer above. Thus, the manufacturing yield of the flexible device array substrate is improved, and the flexible device array substrate has favorable toughness.

Furthermore, in the flexible device array substrate and the manufacturing method thereof according to the disclosure, the metal-containing layer after the peeling operation may be further processed (such as a patterning process and a thickening process), so as to improve the light permeability, protection, toughness, and flexibility of the flexible device array substrate. In addition, the metal layer may be partially thickened for areas that require structural protection or electromagnetic shielding protection.

Although the disclosure has been described with reference to the above embodiments, the embodiments are not intended to limit the disclosure. A person of ordinary skill in the art may make variations and modifications without departing from the spirit and scope of the disclosure. Therefore, the protection scope of the disclosure is defined by the appended claims.

What is claimed is:

1. A flexible device array substrate, comprising:
    a substrate;
    a metal-containing layer disposed on the substrate and comprising:
        a first layer located on a side close to the substrate and having a peeling interface therein; and
        a second layer located on a side away from the substrate, wherein the first layer comprises a metal oxide with low oxidation number and a metal oxide with high oxidation number, and the second layer comprises the metal oxide with low oxidation number; and
    an electronic component layer disposed above the metal-containing layer.

2. The flexible device array substrate according to claim 1, wherein a metal of the metal-containing layer is selected from molybdenum, vanadium, niobium, tantalum, tungsten, rhenium, chromium, and a combination thereof.

3. The flexible device array substrate according to claim 1, wherein the metal-containing layer comprises a multi-layer structure.

4. The flexible device array substrate according to claim 1, wherein the second layer comprises a metal with an oxidation number being zero.

5. The flexible device array substrate according to claim 1, further comprising:
    a barrier layer disposed between the metal-containing layer and the electronic component layer.

6. The flexible device array substrate according to claim 5, further comprising:
    a flexible layer disposed between the barrier layer and the metal-containing layer.

7. The flexible device array substrate according to claim 1, further comprising:
    a display element layer disposed on the electronic component layer,
    wherein the display element layer comprises a first light emitting element, a second light emitting element, and a third light emitting element disposed adjacent to each other.

8. The flexible device array substrate according to claim 7, further comprising:
    an optical clear adhesive layer disposed on the display element layer; and
    a cover lens layer disposed on the optical clear adhesive layer.

9. A manufacturing method of a flexible device array substrate, comprising:
    providing a substrate;
    forming a metal-containing layer on the substrate;
    performing a thermal process for the metal-containing layer to form a first layer and a second layer, wherein the first layer is located on a side close to the substrate, the first layer has a peeling interface therein, the second layer is located on a side away from the substrate, the first layer comprises a metal oxide with low oxidation number and a metal oxide with high oxidation number, and the second layer comprises the metal oxide with low oxidation number;
    forming an electronic component layer above the metal-containing layer; and
    performing a peeling operation to separate a part of the first layer and the substrate at the peeling interface.

10. The manufacturing method of the flexible device array substrate according to claim 9, wherein a metal of the metal-containing layer is selected from molybdenum, vanadium, niobium, tantalum, tungsten, rhenium, chromium, and a combination thereof.

11. The manufacturing method of the flexible device array substrate according to claim 9, wherein the metal-containing layer comprises a multi-layer structure.

12. The manufacturing method of the flexible device array substrate according to claim 9, wherein the second layer comprises a metal with an oxidation number being zero.

13. The manufacturing method of the flexible device array substrate according to claim 9, further comprising:
    forming a barrier layer between the metal-containing layer and the electronic component layer.

14. The manufacturing method of the flexible device array substrate according to claim 9, further comprising:
    forming a display element layer on the electronic component layer,
    wherein the display element layer comprises a first light emitting element, a second light emitting element, and a third light emitting element disposed adjacent to each other.

15. The manufacturing method of the flexible device array substrate according to claim 14, further comprising:
    sequentially forming an optical clear adhesive layer and a cover lens layer on the display element layer.

16. The manufacturing method of the flexible device array substrate according to claim 9, wherein a temperature range of the thermal process is 350° C. to 650° C.

17. The manufacturing method of the flexible device array substrate according to claim 9, wherein a temperature range of the thermal process is 500° C. to 650° C.

18. The manufacturing method of the flexible device array substrate according to claim 9, wherein the thermal process is performed before the electronic component layer is formed.

19. The manufacturing method of the flexible device array substrate according to claim 9, wherein the thermal process is performed when the electronic component layer is formed.

20. The manufacturing method of the flexible device array substrate according to claim 9, further comprising:
    performing a rapid thermal annealing process before the electronic component layer is formed.

21. The manufacturing method of the flexible device array substrate according to claim 9, further comprising:
    performing a patterning process to leave a pattern of the second layer at least in a bent area of the flexible device array substrate.

22. The manufacturing method of the flexible device array substrate according to claim 21, further comprising:
    forming a thickened pattern layer on the pattern of the second layer.

23. A flexible device array substrate comprising a display area and a bent area located on a side of the display area, the flexible device array substrate comprising:
- a first film;
- a metal-containing layer disposed on a first surface of the first film and located at least in the bent area;
- an electronic component layer disposed on a second surface of the first film, wherein the second surface and the first surface are opposite to each other; and
- a display element layer disposed on the electronic component layer, wherein the display element layer comprises a first light emitting element, a second light emitting element, and a third light emitting element disposed adjacent to each other,
- wherein a pattern of the metal-containing layer is disposed corresponding to intervals between the first light emitting element, the second light emitting element, and the third light emitting element.

24. The flexible device array substrate according to claim 23, further comprising:
- an optical clear adhesive layer disposed on the display element layer; and
- a cover lens layer disposed on the optical clear adhesive layer.

25. The flexible device array substrate according to claim 23, wherein the metal-containing layer comprises:
- a first part and a second part connected to each other,
- wherein the first part is disposed in the display area, and the second part is disposed in the bent area.

26. The flexible device array substrate according to claim 25, further comprising:
- a thickened pattern layer disposed on the metal-containing layer.

27. The flexible device array substrate according to claim 23, wherein the metal-containing layer comprises:
- a first part and a second part separated from each other, wherein the first part is disposed in the display area, and the second part is disposed in the bent area.

28. The flexible device array substrate according to claim 27, further comprising:
- a thickened pattern layer disposed on the first part of the metal-containing layer.

29. The flexible device array substrate according to claim 23, wherein the first film comprises a bent part,
- the metal-containing layer is disposed on the bent part, and
- a bending direction of the bent part is opposite to light emitting directions of the first light emitting element, the second light emitting element, and the third light emitting element.

30. The flexible device array substrate according to claim 29, further comprising:
- a thickened pattern layer disposed on the metal-containing layer located on the bent part.

31. The flexible device array substrate according to claim 23, further comprising:
- a thickened pattern layer disposed on the pattern of the metal-containing layer.

32. The flexible device array substrate according to claim 23, further comprising:
- a second film carrying the display element layer;
- a color filter pattern layer disposed corresponding to the display element layer and comprising a first filter pattern, a second filter pattern, and a third filter pattern disposed adjacent to each other; and
- a thickened pattern layer disposed on the metal-containing layer located on the bent part of the first film,
- wherein the color filter pattern layer is located between the first film and the second film, and
- the first film and the second film are flexible substrates.

* * * * *